US007002435B2

(12) United States Patent
Mishima et al.

(10) Patent No.: US 7,002,435 B2
(45) Date of Patent: Feb. 21, 2006

(54) VARIABLE CAPACITANCE CIRCUIT, VARIABLE CAPACITANCE THIN FILM CAPACITOR AND RADIO FREQUENCY DEVICE

(75) Inventors: Tsuneo Mishima, Kyoto (JP); Tetsuya Kishino, Kyoto (JP); Hideharu Kurioka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/670,752

(22) Filed: Sep. 25, 2003

(65) Prior Publication Data

US 2004/0164819 A1 Aug. 26, 2004

(30) Foreign Application Priority Data

| | | | |
|---|---|---|---|
| Sep. 27, 2002 | (JP) | ...................................... | 2002-284377 |
| Nov. 28, 2002 | (JP) | ...................................... | 2002-346583 |
| Dec. 26, 2002 | (JP) | ...................................... | 2002-377404 |
| Dec. 26, 2002 | (JP) | ...................................... | 2002-377483 |

(51) Int. Cl.
*H01H 7/06* (2006.01)
*H01G 7/06* (2006.01)

(52) U.S. Cl. ....................... 333/174; 333/172; 333/185; 327/334

(58) Field of Classification Search ......... 333/170–172, 333/174, 185; 327/334, 586; 257/68, 71
See application file for complete search history.

(56) References Cited

U.S. PATENT DOCUMENTS

| | | | | | |
|---|---|---|---|---|---|
| 3,569,795 A | | 3/1971 | Gikow | | |
| 4,410,867 A | * | 10/1983 | Arcidiacono et al. | ....... | 333/172 |
| 5,379,008 A | * | 1/1995 | Bockelman et al. | ........ | 333/174 |
| 5,893,731 A | * | 4/1999 | Lee et al. | .................. | 438/238 |
| 6,018,282 A | | 1/2000 | Tsuda | | |
| 6,100,773 A | * | 8/2000 | Nakamichi et al. | ........... | 333/32 |
| 6,285,542 B1 | * | 9/2001 | Kennedy, III et al. | ...... | 361/328 |
| 6,674,321 B1 | * | 1/2004 | York | .......................... | 327/586 |

FOREIGN PATENT DOCUMENTS

| | | |
|---|---|---|
| JP | 08-509103 | 9/1996 |
| JP | 11-260667 | 9/1999 |
| WO | 94/13028 | 6/1994 |

* cited by examiner

*Primary Examiner*—Seungsook Ham
(74) *Attorney, Agent, or Firm*—Hogan & Hartson LLP

(57) ABSTRACT

There is disclosed a variable capacitance circuit which comprises: first to Nth variable capacitance elements C1–CN (N is an odd number) sequentially connected in series between an input terminal I and an output terminal O, whose capacitances change depending on voltage applied thereto; an ith bias line on the input terminal side provided between an input terminal portion of the first variable capacitance element and a connection point between a 2ith variable capacitance element and a (2i+1)th variable capacitance element; and an ith bias line on the output terminal side provided between an output terminal portion of the Nth variable capacitance element and a connection point between a (2i−1)th variable capacitance element and the 2ith variable capacitance element, where N and i are integers satisfying $N=2n+1$, $n \geqq 1$, $1 \leqq i \leqq n$. With the arrangement of the variable capacitance circuit, it is possible to provide a variable capacitance thin film capacitor device whose capacitance change ratio is small in a radio frequency region and large in a direct current region can be provided. Furthermore, a radio frequency device utilizing the variable capacitance thin film capacitor device can be provided.

31 Claims, 14 Drawing Sheets

VARIABLE CAPACITANCE CIRCUIT, VARIABLE CAPACITANCE THIN FILM CAPACITOR AND RADIO FREQUENCY DEVICE

This application is based on applications Nos. 2002-284377, 2002-377404, 2002-346583, and 2002-377483 filed in Japan, the content of which is incorporated hereinto by reference.

BACKGROUND OF THE INVENTION

1. Field of the Invention

The present invention relates to a variable capacitance circuit capable of greatly changing capacitance by application of DC (direct current) bias voltages, while minimizing capacitance change, noises and nonlinear distortion due to radio frequency signals.

The present invention also relates to a variable capacitance thin film capacitor including the foregoing variable capacitance circuit formed on a supporting substrate.

The present invention further relates to radio frequency devices using the forgoing variable capacitance thin film capacitor, including voltage controlled radio frequency resonator, voltage controlled radio frequency filter, voltage controlled matching circuit chip, voltage controlled antenna duplexer and the like.

2. Description of the Related Art

There is a conventionally known thin film capacitor whose upper and lower electrode layers and dielectric layer are formed of thin films. Usually, this is fabricated by stacking lamellar layers including a lower electrode layer, a dielectric layer and an upper electrode layer in this order on an electrically insulative supporting substrate. In such a thin film capacitor, the lower electrode layer and upper electrode layer are deposited by sputtering, vacuum deposition or the like, and the dielectric layer is deposited by sputtering, the sol-gel process or the like. In the manufacture of such a thin film capacitor, a photolithography process as described below is usually used.

First, a conductor layer serving as the lower electrode layer is formed all over the insulative supporting substrate, and then only desired portions are masked with a resist. Thereafter, unnecessary portions are removed by wet or dry etching, thereby forming a lower electrode layer with a predetermined pattern. Subsequently, a dielectric layer serving as the thin film dielectric layer is deposited all over the supporting substrate, and then, in the same way as the lower electrode, unnecessary portions are removed to form a thin film dielectric layer with a predetermined pattern. Lastly, a conductor layer serving as the upper electrode layer is deposited all over the surface, and unnecessary portions are removed to form an upper electrode layer with a predetermined pattern. In addition, a protective layer and solder terminal portions are formed on top of the stacked layers. Through these steps, the thin film capacitor becomes ready to be surface-mounted on a circuit board.

There is also a known variable capacitance thin film capacitor, which employs $(Ba_xSr_{1-x})Ti_yO_{3-z}$ as the material for the thin film dielectric layer, in which a predetermined bias potential is applied between the upper and lower electrode layers so as to vary the dielectric constant of the dielectric layer, thereby varying the capacitance of the thin film capacitor. The structure thereof is similar to the foregoing one. A variable capacitance thin film capacitor is disclosed, for example, in the patent document 1 (Japanese Patent Laid-Open Publication No. 1999-260667).

In variable capacitance thin film capacitors, the dielectric constant is varied by application of DC bias, and consequently, the capacitance is varied. Change in capacitance also occurs in a radio frequency region, so that they can be used as variable capacitance thin film capacitors at radio frequencies.

By utilizing such capacitance change of the variable capacitance thin film capacitors at radio frequencies, electronic devices whose frequency characteristics can be varied by application of DC bias can be produced. For example, in a voltage controlled thin film resonator combining the forgoing variable capacitance thin film capacitor and a thin film inductor, the resonant frequency can be varied by application of DC bias. In a voltage controlled thin film bandpass filter combining the variable capacitance thin film capacitor or a voltage controlled thin film resonator with a thin film inductor and a thin film capacitor, the bandpass range can be varied by application of DC bias. An example related to voltage controlled electronic devices for microwaves is disclosed in the patent document 2 (Published Japanese translation of a PCT application No. 1996-509103).

When such a variable capacitance thin film capacitor as described above is used in a radio frequency electronic device, DC bias voltage for varying capacitance and voltage of radio frequency signal (radio frequency voltage) are simultaneously applied to the variable capacitance thin film capacitor. If the radio frequency voltage is high, the capacitance of the variable capacitance thin film capacitor is caused to change also by the radio frequency voltage. When such a variable capacitance thin film capacitor is used in a radio frequency electronic device, capacitance change in the capacitor due to radio frequency voltages will produce waveform distortion and noises caused by intermodulation distortion.

In order to minimize waveform distortion and noises caused by intermodulation distortion, capacitance change caused by radio frequency voltage needs to be minimized by reducing the intensity of the radio frequency electric field. For this purpose, increasing the thickness of the dielectric layer is effective. However, increasing the thickness of the dielectric layer causes the intensity of direct current electric field to decrease, which leads to the problem that the capacitance change ratio is also reduced.

Since, electric current easily flows through the capacitor at radio frequencies, a resistance loss in the capacitor causes generation of heat leading to breakdown of itself. To deal with the power handling capability problem as above, increasing the thickness of the dielectric layer so as to decrease the calorific value per unit volume is also effective. However, as described above, since increasing the thickness of the dielectric layer causes the intensity of direct current electric field to decrease, this also poses the problem of reduction in capacitance change ratio by application of DC bias.

Meanwhile, in the manufacture of thin film capacitors, generally, layers having other functions such as a protective layer and a solder diffusion barrier layer are successively stacked in addition to the lower electrode layer, thin film dielectric layer and the upper electrode layer. However, as the number of layers increases, in addition to problems such as misalignment in the photolithography process and damage to the lower layer during etching, stress is enhanced by the increase of the number of the layers, resulting in cracking in the films, which leads to undesirable characteristics and degraded reliability.

An object of the present invention is to provide a variable capacitance circuit and variable capacitance thin film capacitor in which capacitance change caused by radio frequency signal is small and capacitance change caused by DC bias is large.

Another object of the present invention is to provide a variable capacitance thin film capacitor in which capacitance change caused by radio frequency signal is small and capacitance change caused by DC bias is large, wherein the size of the device is maintained even when a new element such as bias lines is added and the number of successively stacked thin film layers is lessened, so that miniaturization and higher integration of the device are effectively achieved, and undesirable characteristics and degradation in reliability are prevented.

A still another object of the present invention is to provide radio frequency devices using the variable capacitance thin film capacitor such as voltage controlled radio frequency thin film resonator, voltage controlled radio frequency thin film filter, voltage controlled matching circuit chip, and voltage controlled thin film antenna duplexer which cause little intermodulation distortion and have high power handling capability.

BRIEF SUMMARY OF THE INVENTION

A variable capacitance circuit according to the present invention comprises: first to Nth variable capacitance elements sequentially connected in series between an input terminal and an output terminal, whose capacitances change depending on voltage applied thereto; an ith bias line on the input terminal side provided between an input terminal portion of the first variable capacitance element and a connection point between a 2ith variable capacitance element and a (2i+1)th variable capacitance element; and an ith bias line on the output terminal side provided between an output terminal portion of the Nth variable capacitance element and a connection point between a (2i−1)th variable capacitance element and the 2ith variable capacitance element, where N and i are integers satisfying $N=2n+1$, $n \geqq 1$, $1 \leqq i \leqq n$. The expression "2ith" above is an ordinal expression meaning "(2*i) th", the "(2i−1)th" means "(2*i−1)th", and the "(2i+1)th" means "(2*i+1)th*, where the asterisk "*" indicates multiplication.

According to the variable capacitance circuit of the present invention, by providing the ith bias line on the input terminal side and ith bias line on the output terminal side, DC bias is supplied alternately to the connection points between the variable capacitance elements through the ith bias line on the input terminal side and the ith bias line on the output terminal side. This allows DC bias to be supplied to all the connected variable capacitance elements independently as well as stably and evenly, enabling maximum utilization of the capacitance change ratio in the variable capacitance elements caused by a change in DC bias voltage. Additionally, at an operational frequency, radio frequency voltage is applied to each of the variable capacitance elements without being so much influenced by the bias lines. This allows capacitance change in the variable capacitance elements due to radio frequency voltage to be minimized. Accordingly, it is possible to provide a variable capacitance circuit in which capacitance change, noises, intermodulation distortion, and nonlinear distortion due to radio frequency signals are minimized.

When the ith bias line on the input terminal side and ith bias line on the output terminal side include a resistance component and/or an inductance component, since there is little possibility that radio frequency signals enter the bias lines, and direct current seldom flows into the variable capacitance elements but flows mostly through the bias lines, the variable capacitance elements can be assumed to be connected in series in the radio frequency region, and to be connected in parallel in the direct current region.

In order to realize the forgoing situation: "The variable capacitance elements can be assumed to be connected in series in the radio frequency region, and to be connected in parallel in the direct current region", it is preferable that the impedance of the ith bias line on the input terminal side or the ith bias line on the output terminal side is selected so that a divided DC voltage applied to one of the series connected first to Nth variable capacitance elements when all the bias lines are not present is smaller than a divided DC voltage applied to one of the series connected first to Nth variable capacitance elements through the bias lines when the bias lines are present. In addition, it is preferable that the impedance of the ith bias line on the input terminal side or the ith bias line on the output terminal side is selected so as to be larger than a combined impedance of the variable capacitance elements connected in parallel to the bias lines at an operational radio frequency.

Since the input terminal can serve both as a signal input terminal for receiving radio frequency signals and as an input terminal for application of DC bias, handling thereof as a capacitor circuit is facilitated. Also, a conventional variable capacitance circuit can be simply replaced with the variable capacitance circuit of the present invention without modifying the circuit in which the variable capacitance capacitor is used.

It is also possible to provide a plurality of groups of the first to Nth variable capacitance elements connected in series between the input and output terminals, and provide the ith bias line on the input terminal side and the ith bias line on the output terminal side in each of the groups.

A variable capacitance thin film capacitor device according to the present invention comprises: first to Nth variable capacitance elements formed on a supporting substrate that are sequentially connected in series, whose capacitances change depending on voltage applied thereto; an ith bias line on an input terminal side provided between an input terminal portion of the first variable capacitance element and a connection point between a 2ith variable capacitance element and a (2i+1)th variable capacitance element; and an ith bias line on an output terminal side provided between an output terminal portion of the Nth variable capacitance element and a connection point between a (2i−1)th variable capacitance element and the 2ith variable capacitance element, where N and i are integers satisfying $N=2n+1$, $n \geqq 1$, $1 \leqq i \leqq n$.

This variable capacitance capacitor device is a device embodying the foregoing variable capacitance circuit. With this arrangement, the device can be realized as a variable capacitance thin film capacitor device with high power handling capability, which provides easy handling and allows large capacitance change by change of DC bias while minimizing capacitance change, noises, and nonlinear distortion due to radio frequency signals.

The variable capacitance thin film capacitor device comprises a lower electrode layer, a thin film dielectric layer and an upper electrode layer that are successively stacked on a supporting substrate. This enables the capacitance of each of the variable capacitance elements to be greatly changed by application of DC bias.

When the thin film dielectric layer comprises $(Ba_xSr_{1-x})Ti_yO_{3-x}$, a variable capacitance thin film capacitor device with variable capacitance elements whose capacitance change ratio is large and whose loss is small can be provided.

The bias lines may be formed over the series connected variable capacitance elements with an insulation layer interposed therebetween, or formed directly on the supporting substrate.

When the bias lines are formed over the variable capacitance elements, the device area can be reduced, which leads to downsizing of the device and lower prices. When the bias lines are formed directly on the supporting substrate, the insulation layer that is required when they are formed over the series connected variable capacitance elements is no longer necessary, so that the number of layers constituting the device can be reduced, thereby preventing deterioration of the characteristics due to cracking in the films and degradation of the reliability.

The bias lines can be provided with an inductance component by forming the bias lines in the form of a straight line, loop, meander or spiral. The same effect as in the case of the bias lines having a resistance component can be obtained.

The material used for the bias lines in whole or in part may be a high resistance alloy such as a Ni—Cr alloy or Fe—Cr—Al alloy, or a precious metal such as Au or Pt, or a ferromagnetic metal such as Ni or Fe, or an oxide conductor, nitride conductor or semiconductor.

Using a thin film of a high resistance alloy such as a Ni—Cr alloy or Fe—Cr—Al alloy makes it possible for a short resistance line to achieve a high resistance.

When precious metals such as Au and Pt are used to form metal thin films by sputtering or the like to a very small thickness, they are not formed into perfect films, but result in minute island-shaped metal agglomerates with poor quality, which results in an abrupt increase in resistance. Precious metals with low resistivity are used for utilizing this property so as to obtain a conductor film with a resistance component of high resistance value and excellent oxidation resistance.

When ferromagnetic materials such as Ni and Fe are used, because of their large magnetic permeability $\mu$, there is a tendency that their skin depths expressed as $\delta=1/\sqrt{(\pi f \mu \sigma)}$ are smaller than those of paramagnetic materials (where f is frequency, $\mu$ is magnetic permeability and $\sigma$ is conductivity) For this reason, even if the films are formed to have a mechanically stable thickness, because the skin depth is small at radio frequencies, they have high resistance. Films with high resistance can therefore be formed.

Bias lines having good adhesion to the insulation layer or the supporting substrate can be formed by using an oxide conductor, nitride conductor or semiconductor.

The bias lines may include, in whole or at least in part, a thin film resistor. Alternatively, the bias lines may comprise a conductor line and a thin film resistor. Since the resistance of a thin film resistor can be much higher than that of a conductor, the resistance of a bias line is almost determined by the resistance of the thin film resistor. By forming the thin film resistors so as to have a uniform thickness and aspect ratio over the whole bias lines, they can have the same resistance value. Accordingly, all the bias lines have the same resistance value, enabling the electrical characteristics such as impedance of the variable capacitance thin film capacitor device to be uniform. In addition, because the resistance of the whole bias lines is high, the aspect ratio (length/width of the bias lines) can be kept small. Accordingly, the size of the device can be maintained to be small even if additional bias lines are provided. This is effective for miniaturization and higher integration of the circuits of the device.

The thin film resistor preferably comprises tantalum and has a specific resistance of 1 mΩcm or more. Because of the inclusion of tantalum, a high resistance thin film resistor comprising tantalum nitride, TaSiN, Ta—Si—O or the like can be readily obtained.

When the thin film resistor has a thickness of 40 nm or more, formation of high resistance thin film resistors can be accomplished with good reproducibility.

Using tantalum nitride for the thin film resistor allows formation of a thin film resistor with a high specific resistance and stability over time, so that it is effective for miniaturization and improvement of the reliability of the device.

For the case where the thin film resistor comprises a thin film of a precious metal including Au or Pt, it has been known that extremely thin films of precious metals are not formed into perfect films but result in minute island-shaped metal agglomerates, so that an abrupt increase in resistance occurs as a result of decrease in the film thickness. Precious metals with low resistivity are used for utilizing this property so as to obtain a thin film resistor and bias lines with high resistance and excellent oxidation resistance.

When the thin film resistor comprises a ferromagnetic thin film including Ni or Fe, because of the large magnetic permeability of ferromagnetic materials, there is a tendency that their skin depths are smaller than those of paramagnetic materials. For this reason, even if the films are formed to have a large thickness for mechanical stability, because the skin depth becomes smaller and the resistance becomes higher at radio frequencies, thin film resistors with high resistance values can be obtained.

Using a thin film of a high resistance alloy such as a Ni—Cr alloy or Fe—Cr—Al alloy for the thin film resistor makes it possible for a short resistance line to achieve a high resistance value.

When the thin film resistor comprises an oxide conductor, nitride conductor or semiconductor, it can be a thin film resistor with good adhesion to the supporting substrate.

It is preferable that the bias lines are coated with at least one kind selected between silicon nitride and silicon oxide, because with this arrangement, the thin film resistor can be protected from oxidation, so that the resistance value of the bias lines can be maintained at a constant value over time, thereby improving the reliability. In addition, it is possible to ensure moisture resistance.

Furthermore, the variable capacitance thin film capacitor device can be used as a part of a resonant circuit, and/or as a capacitance element for coupling a plurality of resonant circuits. With this structure, voltage controlled radio frequency resonant circuits can be produced using the variable capacitance thin film capacitor device with excellent temperature characteristics that allows series connection of the capacitance elements in a radio frequency region and parallel connection of the same in a direct current region. In addition, it is possible to provide radio frequency devices with excellent power handling capability and minimal waveform distortion and noises due to intermodulation distortion such as a voltage controlled radio frequency filter, voltage controlled matching circuit chip, and voltage controlled antenna duplexer.

DETAILED DESCRIPTION OF THE INVENTION

The variable capacitance circuit, variable capacitance thin film capacitor device and high frequency device according to the present invention will be hereinafter described with reference to the appended drawings.

First Embodiment

Figure 1:
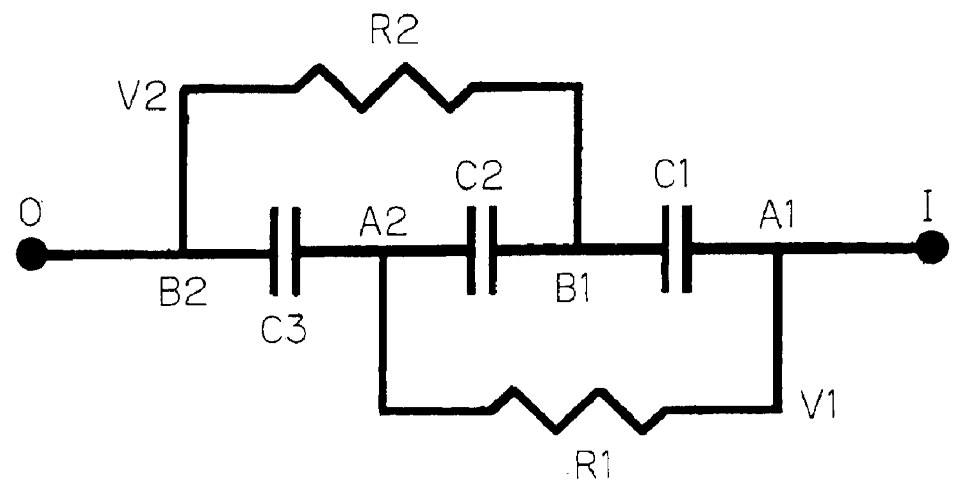
FIG. 1 is a circuit diagram illustrating a variable capacitance circuit according to a first embodiment of the present invention.

FIG. 1 is a circuit diagram illustrating a variable capacitance circuit according to a first embodiment of the present invention. FIG. 1 shows three variable capacitance elements C1–C3 (a first variable capacitance element C1, a second variable capacitance element C2, and a third variable capacitance element C3) connected in series. The circuit also includes a first bias line V1 and a second bias line V2 that have resistance components or inductance components connected thereto (resistance components R1, R2 are shown in FIG. 1). In addition, an input terminal I is provided anterior to the variable capacitance element C1, and an output terminal O is provided posterior to the third variable capacitance element C3. These input and output terminals I and O serve as the input and output terminals for radio frequency signals and also as the voltage input terminals for applying DC bias voltages.

To describe more specifically, the first bias line V1 having the resistance component R1 is provided between an input terminal portion A1 of the first variable capacitance element C1 and a connection point A2 between the second variable capacitance element C2 and third variable capacitance element C3. The second bias line V2 having the resistance element R2 is provided between a connection point B1 between the first and second variable capacitance elements C1, C2 and an output terminal portion B2 of the third variable capacitance element C3.

Here, the resistance components R1 and R2 of the bias lines V1 and V2 have resistances larger than the impedance of the signal line connecting the variable capacitance elements C1–C3 in series in the frequency region of radio frequency signals. Radio frequency signals pass through the series-connected variable capacitance elements C1–C3, and DC bias is applied separately to each of the variable capacitance elements C1–C3 via the bias lines.

If the resistance components R1 and R2 of the first and second bias lines V1, V2 are too small, radio frequency signals are also introduced into the first and second bias lines V1 and V2, which increases capacitance change caused by the radio frequency signals, resulting in lowering of the Q of the variable capacitance circuit. On the other hand, if the resistance components R1, R2 are too large, the time constant becomes large, so that it takes a long time for the capacitance change to become constant after the application of DC bias.

For this reason, it is necessary to determine resistance values of the first and second bias lines V1 and V2 according to the use conditions of the variable capacitance circuit.

In the circuit diagram shown in FIG. 1, bias current supplied from the input terminal I passes through the insulation resistance of the variable capacitance element C1, enters the second bias line V2 from the connection point B1 to flow into the output terminal O. Also, bias current supplied from the input terminal I passes through the first bias line V1 and is fed to the connection point A2, from which the current passes through the insulation resistance of the third variable capacitance element C3 to flow into the output terminal O. In addition, from the connection point A2, bias current passes through the insulation resistance of the second variable capacitance element C2, flows into the second bias line V2 from the connection point B1, and flows into the output terminal O via the connection point B2. As described above, there are three flows of bias current.

Figure 2:
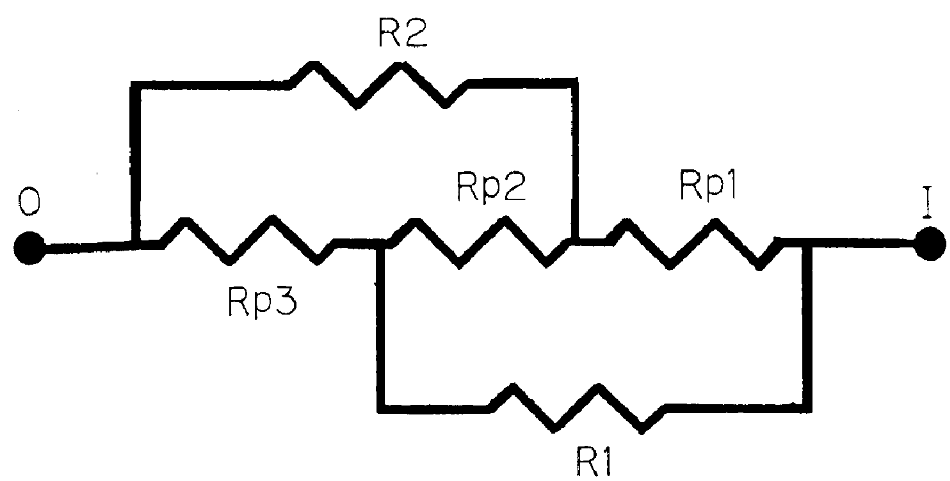
FIG. 2 shows a DC equivalent circuit where the capacitance elements of the variable capacitance circuit are replaced with resistance components.

A process for determining the resistance components R1 and R2 is now described based on FIG. 2 that is a diagram of a direct current equivalent circuit. As shown in FIG. 2, the variable capacitance elements C1–C3 are replaced with insulation resistances Rp1, Rp2 and Rp3.

The upper limit value of the resistance components R1, R2 is determined such that a voltage applied to the variable capacitance elements C1–C3 through the bias lines V1 and V2 is larger than a voltage applied to the variable capacitance elements C1–C3 when the bias lines V1, V2 are not present.

First, concerning the variable capacitance element C1, the voltage applied to the variable capacitance element C1 when the bias lines are not present is Rp1/(Rp1+Rp2+Rp3). When the bias line V2 is present, the bias voltage applied to the variable capacitance element C1 through the bias line V2 is Rp1/(R2+Rp1). Therefore, the following inequality needs to be satisfied as a prerequisite:

$$Rp1/(R2+Rp1)>Rp1/(Rp1+Rp2+Rp3)$$

This is transformed into:

$$R2<Rp2+Rp3$$

That is, Rp2+Rp3 is the upper limit of R2.

Likewise, concerning the variable capacitance element C2, the following inequality needs to be satisfied as a prerequisite:

$$Rp2/(R1+R2+Rp2)>Rp2/(Rp1+Rp2+Rp3)$$

This transformed into:

$$R1+R2<Rp1+Rp3$$

Therefore, Rp1+Rp3 is the upper limit of R1+R2.

Likewise, concerning the variable capacitance element C3, the following inequality needs to be satisfied as a prerequisite:

$$Rp3/(R1+Rp3)>Rp3/(Rp1+Rp2+Rp3)$$

This transformed into:

$$R1<Rp2+Rp3$$

Therefore, Rp2+Rp3 is the upper limit of R1.

Assume that R1=R2=R, Rp1=Rp2=Rp3=Rp=1 GΩ. In order to simultaneously satisfy the three inequalities above, R<1 GΩ needs to be satisfied.

Incidentally, when the resistance at which the bias voltages applied to the variable capacitance elements C1–C3 are 1/10 of those in the previous case is assumed to be the upper limit, R<100 MΩ needs to be satisfied.

If the quadruple of the time constant is required to be smaller than a required response time T, $$T>4*2*RC$$

needs to be satisfied. The asterisk "*" indicates multiplication. This is transformed into:

$$R<T/8C$$

Given that T=10 μs, and capacity C=2 pF, the following inequality is obtained:

$$R<10*10exp-6/8*2*10exp-12=625\ k\Omega$$

If the response time can be on the order of milliseconds, the upper limit of R is 62 MΩ or so.

Now, the lower limit values of R1, R2 are discussed. At a frequency of radio frequency signals for use (operational frequency), the combined impedance of (C1+C2) needs to be smaller than R1, and the combined impedance of (C2+C3) needs to be smaller than R2 in the series connected variable capacitance elements C1–C3. If this is satisfied, the frequency at which the combined impedance of (C1+C2) equals to R1 is smaller than the operational frequency, and the frequency at which the combined impedance of (C2+C3) equals to R2 is smaller than the operational frequency. That is, the following inequities are satisfied at an operational frequency ω:

$$R1>(C1+C2)/(\omega C1C2)$$

$$R2>(C2+C3)/(\omega C2C3)$$

Given that R1=R2=R, C1=C2=C3=C=2 pF, and the operational frequency is 2 GH, the following is obtained:

$$R>2C/\omega C\hat{}2=2/\omega C=80\Omega$$

Here, the sign "^" represents exponentiation. For example, C^2 represents the second power of C. To satisfy the forgoing condition that "the combined impedance of (C1+C2) needs to be smaller than R1, and the combined impedance of (C2+C3) needs to be smaller than R2" at a frequency that is 1/10 of the operational frequency, satisfying R>800Ω is necessary.

From the discussion above, the resistance components R1, R2 of the first and second bias lines V1, V2 may be in a range of about several hundred ohms to 100 MΩ.

Figure 3:
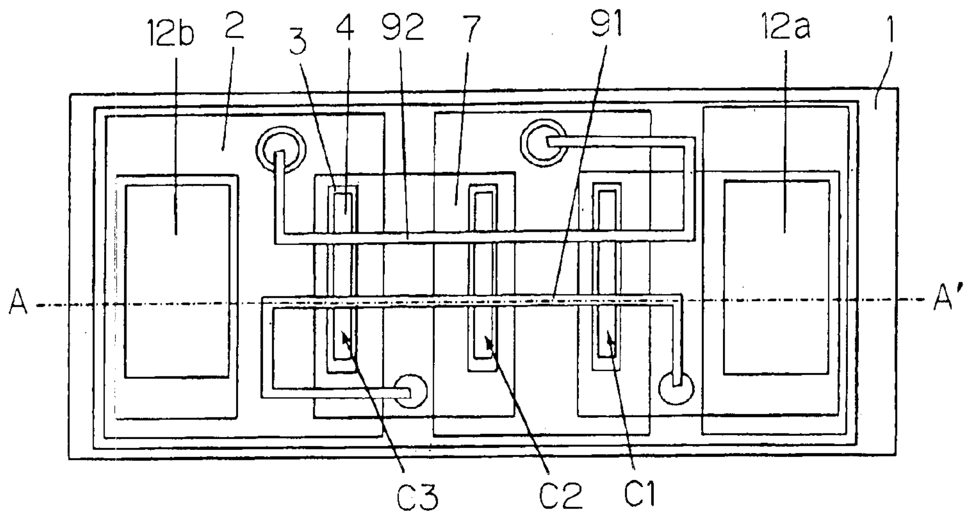
FIG. 3 is a plan view of a variable capacitance thin film capacitor device.
Figure 4:
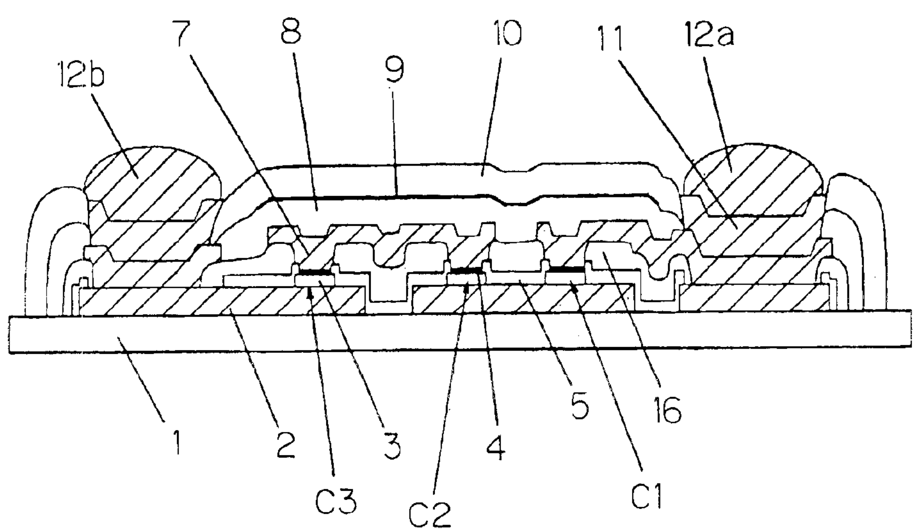
FIG. 4 is a cross sectional view taken along the line A–A' of FIG. 3.

Referring now to FIGS. 3 and 4, a variable capacitance thin film capacitor device of the present invention comprising variable capacitance elements C1–C3 that are series-connected to one another will be described.

Incidentally, FIG. 3 is a plan view depicted in phantom to clearly show the arrangement of the films, and FIG. 4 is a cross-sectional view taken along the bias line A–A'. Rounding at corners is not shown in FIG. 3.

In FIG. 3 and 4, there are shown a supporting substrate 1, a lower electrode layer 2, a thin film dielectric layer 3, and an upper electrode layer 4. The elements denoted by 16, 7 and 8 are a second insulation layer, an extraction electrode and a third insulating layer, respectively. The elements denoted by 9 are bias lines, where a first bias line is denoted by 91 and a second bias line is denoted by 92. There are also provided a forth insulation layer 10, a solder diffusion barrier layer 11, and solder terminal portions 12*a* and 12*b*, where the terminal portion on the side of input terminal I is denoted by 12*a*, and the terminal portion on the side of output terminal O is denoted by 12*b*.

A first insulation layer 5 is provided around the thin film dielectric layer 3 and upper electrode layer 4. In the Figure, the elements denoted by C1–C3 are variable capacitance elements comprising the thin film dielectric layers 3 whose capacitance components can be varied by bias voltage.

The supporting substrate 1 is a ceramic substrate comprising alumina or the like, or a monocrystal substrate of sapphire or the like. The lower electrode layer 2, thin film dielectric layer 3 and upper electrode layer 4*a* are deposited over the entire surface of the supporting substrate 1 by sputtering in the same batch. Thereafter, the thin film dielectric layer 3 and the upper electrode layer 4 are first physically etched into the same pattern using a resist layer with a predetermined pattern. Then, the lower electrode layer 2 is physically or chemically etched using a resist with a predetermined pattern.

Since sputtering at a high temperature is required for the deposition of the thin film dielectric layer 3, the material for the lower electrode layer 2 is Pt, Pd or the like which has a high melting point and is precious metal. The lower electrode layer 2 is deposited, for example, under a condition where the substrate temperature is 150–600° C. Then, by heating the lower electrode layer to a temperature for the sputtering of the thin film dielectric layer 3, which is 700–900° C., and holding it for a set period of time until the start of the sputtering, the lower electrode layer 2 becomes a flattened thin film. Subsequently, the thin film dielectric layer 3 is deposited by sputtering.

The thickness of the lower electrode layer 2 is determined taking the following into consideration: the resistance component in the area from the terminal portion 12*b*, for example, to the third variable capacitance element C3; continuity of the lower electrode layer 2; and adhesion to the supporting substrate 1. In order to lower the resistance component and keep the lower electrode layer 2 continuous, the thickness of the lower electrode layer 2 is preferably large. For good adhesion to the supporting substrate 1, a relatively thin lower electrode layer 2 is preferred. Taking these into consideration, the thickness of the lower electrode layer 2 is specified, for example, as 0.1–10 $\mu$m. When the thickness is smaller than 0.1 $\mu$m, not only the resistance of the electrode itself becomes great, but also the electrode loses continuity, degrading the reliability. On the other hand, when the thickness is greater than 10 $\mu$m, the adhesion reliability between the lower electrode layer and the supporting substrate 1 is lowered, and warpage occurs in the supporting substrate 1.

The metal material constituting the lower electrode layer 2 is the above stated precious metal having a high melting point such as Pt or Pd. However, it is also possible to form a multilayered stack using these precious metals with high melting point and Au, Ag, Cu and the like so as to further lower the resistance value.

The thin film dielectric layer 3 is a dielectric layer having a high dielectric constant, which comprises perovskite type oxide crystal grains including at least Ba, Sr and Ti. The thin film dielectric layer 3 is formed on the surface of the lower electrode layer 2. A method for forming the thin film dielectric layer is, for example, sputtering using a dielectric from which perovskite type oxide crystal grains can be obtained as the target. For example, with a substrate temperature of 800° C., sputtering is carried out for a length of time necessary for obtaining the desired thickness. By the sputtering at a high temperature, a thin film dielectric layer 3 with a high dielectric constant, high change ratio, and minimal loss can be obtained without a heat treatment after the sputtering.

The material for the upper electrode layer 4 is preferably Au having a small resistivity for reducing the resistance of the electrode. Also, other materials such as Ag and Cu may be used. To enhance the adhesion to the thin film dielectric layer 3, precious metal with high melting point such as Pt or Pd may be used in a part of the layer. The thickness of the upper electrode layer 4 is specified as 0.1–10 $\mu$m. The lower limit of the thickness is determined taking the resistance of the electrode itself and the like into consideration as in the case of the lower electrode layer 2. The upper limit of the thickness is determined taking lowering of the adhesion into consideration.

In the variable capacitance thin film capacitor device according to the present invention, since the lower electrode layer 2, thin film dielectric layer 3 and the upper electrode layer 4 can be deposited by sputtering in the same batch as described above, film formation can be accomplished up to the upper electrode layer without exposure to air. Accordingly, unwanted oil adhesion or the like is not caused between the lower electrode layer 2 and thin film dielectric layer 3 or between the thin film dielectric layer 3 and the upper electrode layer 4, so that the adhesion is greatly improved. As a result, infiltration of moisture between the lower electrode layer 2 and thin film dielectric layer 3 or between the thin film dielectric layer 3 and the upper electrode layer 4 can be prevented, thereby greatly improving the moisture resistance. It is therefore possible to form variable capacitance elements C1–C3 capable of exhibiting very stable characteristics.

The aforementioned first insulation layer 5 is formed around the thin film dielectric layer 3 and upper electrode layer 4. Materials used for this layer are ceramics such as $SiO_2$, $Si_3N_4$ and the like. Such an insulation layer 5 is formed, for example, on the lower electrode layer 2, upper electrode layer 4 and the supporting substrate 1. Then unnecessary portions are removed by dry etching so that the upper surface of the upper electrode layer and terminal portions of the bias lines 9 are exposed.

Other than the common dry etching process using a resist, the following process may be used. When the insulation layer 5 is formed by sputtering, since the target constituents are released from a certain point on the target in various directions, the target constituents coming from various directions are deposited on a certain point on the supporting substrate 1. However, in the dry etching process, etching is effected by ions accelerated between the parallelly disposed electrodes of the etching device. For this reason, the etching proceeds in a direction perpendicular to the film. The top surface of the upper electrode layer 4 is formed using Au, which has poor adhesion to the insulation layer 5, so that at a point during the etching when the insulation layer 5 on the upper electrode layer 4 and the insulation layer 5 around the layer are completely separated from each other, the insulation layer 5 on the upper electrode layer 4 can be automatically removed. In cases where the insulation layer cannot be removed for some reason, it can be completely removed by ultrasonic cleaning or heating at a temperature of 300° C. or so. In such a process, the size and positioning accuracy of the resist layer are not important, and therefore a resist layer with apertures larger than the upper electrode layer portions 4 may be used. Similar processing is possible without using a resist at all. Since the insulation layer 5 around the upper electrode layer 4 and the thin film dielectric layer 3 is also etched during the etching, stray capacitance may be caused. Therefore, the thickness of the insulation layer in the initial state is preferably large.

Meanwhile, the first insulation layer 5 is formed so that at least the solder terminal portions 12*a*, 12*b* and terminal portions at which the bias lines 9 are formed are exposed. To fill gaps among the lower electrode portions, a second insulation layer 16 is formed using ceramics such as $SiO_2$ or $Si_3N_4$, or an organic material such as BCB (benzocyclobutene), polyimide or the like.

The extraction electrode 7 connects the upper electrode layer 4 to (one of) the terminal portions and the upper electrode layer portions 4 together so as to connect the first variable capacitance element C1 to the terminal portion 12*a* as well as to connect the second variable capacitance element C2 and third variable capacitance element C3 in series. Inexpensive, low resistance metals such as Ag and Cu maybe used for the extraction electrode 7. The size thereof is determined taking stray capacitance and resistance into consideration.

The third insulation layer 8 is formed so that the solder terminal portions 12*a* and 12*b* and the terminal portions of the bias lines 9 are exposed. For the insulation layer 8, $SiO_2$, SiN, BCB (benzocyclobutene) and polyimide and the like are preferably used. It may be a multilayer of these materials. This third insulation layer 8 is provided for insulation between the bias lines 9 and the extraction electrode 7.

The bias lines 9 comprise the first bias line V1 (91) connecting the connection point Al to the connection point A2 and the second bias line V2 (92) connecting the connection point B1 to the connection point B2. The bias lines 9 are connected to the lower electrode 2 or the extraction electrode 7 through via holes formed in the first insulation layer 5, second insulation layer 16 and third insulation layer 8.

Since the bias lines 9 are intended to have the predetermined resistance components R1 and R2, high resistance materials such as Ni—Cr alloys, Fe—Cr—Al alloys, precious metals such as Au and Pt, or ferromagnetic materials such as Ne, Fe may be used for the bias lines. The resistance components are adjusted by controlling the thicknesses thereof.

The bias lines 9 are disposed, for example, as shown in FIG. 3, over the variable capacitance elements C1–C3 with the insulation layer 8 interposed therebetween.

The forth insulation layer 10 has the function of protecting the device from mechanical shocks from the outside, as well as the function to prevent deterioration due to humidity, contamination by chemicals, and oxidation.

The solder diffusion barrier layer 11 is provided to prevent solder from diffusing into the electrodes during reflow. The solder terminal portions 12*a* and 12*b* are formed by printing solder paste followed by reflow. It is also possible to form bumps of gold or the like by fast bonding of a metal wire and then cutting into a predetermined length.

As discussed so far, in the variable capacitance thin film capacitor device, the variable capacitance elements C1–C3 are connected in series and the variable capacitance elements C1–C3 are each connected to the bias lines 9 having the resistance components R1 and R2, and the input terminal I and output terminal O (12*a*, 12*b*) are used for both radio frequency and direct current.

A variable capacitance circuit with three variable capacitance elements C1–C3 connected in series has been described so far. However, generally, the present invention is applicable to variable capacitance circuits having N (N is an integer not smaller than 3) variable capacitance elements.

Hereinafter, a variable capacitance circuit where N=5 will be described.

Figure 5:
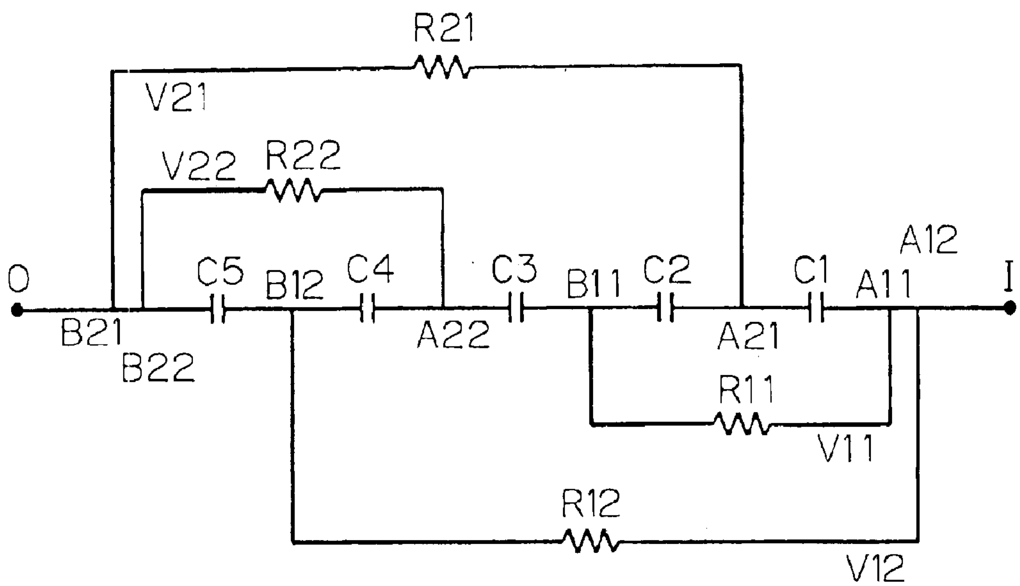
FIG. 5 is a circuit diagram illustrating another variable capacitance circuit according to the first embodiment of the present invention.

FIG. 5 illustrates a variable capacitance circuit according to the present invention where N=5. FIG. 5 shows five variable capacitance elements C1–C5 (first variable capacitance element C1, second variable capacitance element C2, third variable capacitance element C3, forth variable capacitance element C4 and fifth variable capacitance element C5) connected in series, and first and second bias lines V11, V12 on the input terminal side and first and second bias lines V21, V22 on the output terminal side having resistance or inductance components (shown as resistance components R11, R12, R21, R22 in FIG. 5).

In FIG. 5, radio frequency signals and DC bias are both inputted from an input terminal I and outputted from an output terminal O, which are both shared.

The first bias line V11 on the input terminal side having the resistance component R11 is provided between an input terminal portion A11 of the first variable capacitance element C1 and a series connection point B11 between the second variable capacitance element C2 and the third variable capacitance element C3. The second bias line V12 on the input terminal side having the resistance component R12 is provided between an input terminal portion A12 of the first variable capacitance element C1 and a series connection point B12 between the forth variable capacitance element C4 and fifth variable capacitance element C5.

The first bias line V21 on the output-terminal side having the resistance component R21 is provided between an output terminal portion B21 of the fifth variable capacitance element C5 and a series connection point A21 between the first variable capacitance element C1 and the second variable capacitance element C2. The second bias line V22 on the output terminal side having the resistance component R22 is provided between an output terminal portion B22 of the fifth variable capacitance element C5 and a series connection point A22 between the third variable capacitance element C3 and forth variable capacitance element C4.

Here, the resistance components R11, R12 of the first and second bias lines V11, V12 on the input terminal side and the resistance components R21, R22 of the first and second bias lines V21, V22 on the output terminal side are each larger than the impedance of the series connected capacitance elements C1–C5 in the same frequency region of radio frequency signals.

Radio frequency signals pass through the series connected variable capacitance elements from C1 to C5. DC bias is applied separately to each of the variable capacitance elements C1–C5 via the bias lines.

If the resistance components R11, R12 of the first and second bias lines V11, V12 on the input terminal side and the resistance components R21, R22 of the first and second bias lines V21, V22 on the output terminal side are too small, a large amount of radio frequency signals are also caused to be introduced into the first and second bias lines V11, V12 on the input terminal side and first and second bias lines V21, V22 on the output terminal side, which increases capacitance change caused by the radio frequency signals, thereby lowering the Q of the variable capacitance circuit.

If the resistance components R11, R12, R21, R22 are too large, DC bias applied to the variable capacitance elements C1–C5 drops, resulting in a reduced capacitance change.

In addition, the time constant becomes large, so that it takes a long time for the capacitance change to become constant after the application of the DC bias. For this reason, it is necessary to determine resistance values according to the use conditions of the variable capacitance circuit.

In the circuit diagram shown in FIG. 5, bias current supplied from the input terminal I is delivered to the first variable capacitance element C1 and enters the first bias line V21 on the output terminal side from the connection point A21 to flow into the output terminal O. Also, bias current supplied from the input terminal I flows into the first bias line V11 on the input terminal side to be fed to the connection point B11, from which the current is supplied to the second variable capacitance element C2. Then, the bias current flows into the first bias line V21 on the output terminal side from the connection point A21 to flow through the connection point B21 into the output terminal O.

Bias current supplied from the input terminal I flows through the first bias line V11 on the input terminal side to be fed to the connection point B11, from which the current is supplied to the third variable capacitance element C3. Then, the bias current flows into the second bias line V22 on the output terminal side from the connection point A22 to flow through the connection point B22 into the output terminal O. Also, bias current supplied from the input terminal I flows through the second bias line V12 on the input terminal side to be fed to the connection point B12, from which the current is supplied to the forth variable capacitance element C4. Then, the bias current flows into the second bias line V22 on the output terminal side from the connection point A22 to flow through the connection point B22 into the output terminal O. Also, bias current supplied from the input terminal I flows through the second bias line V12 on the input terminal side to be fed to the connection point B12, from which the current is supplied to the fifth variable capacitance element C5 to directly flow into the output terminal O.

Figure 6:
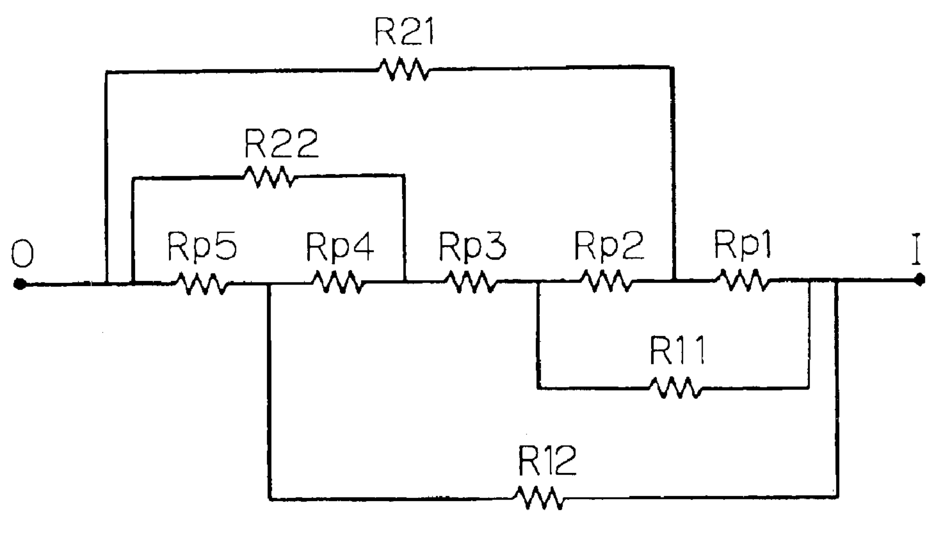
FIG. 6 shows a DC equivalent circuit where the capacitance elements of the circuit in FIG. 5 are replaced with resistance components.

FIG. 6 is a circuit diagram showing a DC equivalent circuit model where the variable capacitance elements C1–C5 are replaced with insulation resistances Rp1, Rp2, . . . , Rp5.

The upper limit value of the resistance components R11, R12, R21 and R22 is determined such that a divided voltage applied to the series-connected insulation resistances Rp1, Rp2, . . . , Rp5 when bias lines are not present is smaller than a voltage applied to the insulation resistances Rp1, Rp2, . . . , Rp5 through the resistance component R11, R12, R21 or R22 when the bias lines are present.

For example, referring to the resistance component R21, when the bias lines are not present, the voltage applied to the variable capacitance element C1 (insulation resistance Rp1) is Rp1/(Rp1+Rp2+Rp3+Rp4+Rp5). When it is assumed that the bias line V21 is present and a direct current flows into the variable capacitance element C1 (insulation resistance Rp1) and the bias line V21, the voltage applied to the variable capacitance element C1 (insulation resistance Rp1) is Rp1/(R21+Rp1). Thus, the aforementioned condition is expressed as follows:

$$Rp1/(R21+Rp1)>Rp1/(Rp1+Rp2+Rp3+Rp4+Rp5)$$

This is transformed into the following:

$$R21<Rp2+Rp3+Rp4+Rp5$$

The value of R21 needs to be determined so as to satisfy the inequality above.

Likewise, concerning the variable capacity element C2 (insulation resistance Rp2), when the bias lines are not present, the voltage applied to the variable capacitance element C2 (insulation resistance Rp2) is expressed as follows:

$$Rp2/(Rp1+Rp2+Rp3+Rp4+Rp5)$$

When it is assumed that the bias lines V11 and V12 are present, and a direct current flows into the variable capacitance element C2 (insulation resistance Rp2) and bias lines V11 and V21, the voltage applied to the variable capacitance element C2 (insulation resistance Rp2) is expressed as follows:

$$Rp2/(R11+R21+Rp2)$$

Thus, the aforementioned condition is expressed as follows:

$$Rp2/(R11+R21+Rp2)>Rp2/(Rp1+Rp2+Rp3+Rp4+Rp5)$$

From this inequality, it is found that R11+R21 needs to be determined to satisfy the following:

$$R11+R21<Rp1+Rp3+Rp4+Rp5$$

Likewise, concerning the variable capacitance element C3, the following inequality needs to be satisfied:

$$Rp3/(R11+R22+Rp3)>Rp3/(Rp1+Rp2+Rp3+Rp4+Rp5)$$

Therefore, the following inequality needs to be satisfied:

$$R11+R22<Rp1+Rp3+Rp4+Rp5$$

Likewise, concerning the variable capacitance element 4C, the following inequality needs to be satisfied:

$$Rp4/(R12+R22+Rp4)>Rp4/(Rp1+Rp2+Rp3+Rp4+Rp5)$$

Therefore, the following inequality needs to be satisfied:

$$R12+R22<Rp1+Rp3+Rp4+Rp5$$

Likewise, concerning the variable capacitance element 5C, the following inequality needs to be satisfied:

$$Rp5/(R12+Rp5)>Rp5/(Rp1+Rp2+Rp3+Rp4+Rp5)$$

Therefore, the following inequality needs to be satisfied:

$$R12<Rp1+Rp2+Rp3+Rp4$$

Here, given that R=11=R12=R21=R22=R, Rp1=Rp2=Rp3=Rp4=Rp5=1 GΩ, the following is obtained as R satisfying the forgoing four inequities:

$$R<2\ G\Omega$$

When the upper limit value of R is assumed to be a resistance value at which the voltage applied to the variable capacitance elements C1, . . . , C5 when the bias lines are present is 1/10 of the voltage applied to each of the variable capacitance elements C1–C5 when the bias lines are not present, the following inequality is satisfied:

$$R<200\ M\Omega$$

When requiring the quadruple of a time constant to be smaller than a desired response time T, the following needs to be satisfied:

$$T>4*2*RC$$

This yields R<T/8 C. Assume that the response time is 10 μs and the capacitance C of the variable capacitance element is 2 pF. Then, the following is obtained:

$$R<10*10\exp-6/8*2*10\exp-12=625\ k\Omega$$

If the response time can be on the order of ms, the upper limit value of R is hundred times as large as the value above, which is about 62 MΩ.

Now, the lower limit values of the resistance components R11, R12, R21, R22 are discussed. The resistance R11 is required to be larger than the combined impedance of the variable capacitance elements (C1+C2). The resistance R12 is required to be larger than the combined impedance of (C1+C2+C3+C4). The resistance R21 is required to be larger than the combined impedance of (C2+C3+C4+C5), and the resistance R22 is required to be larger than the combined impedance of (C4+C5). In other words, the following inequalities need to be satisfied:

$$R11>(C1+C2)/(\omega C1C2)$$

$$R12>(C1C2C3+C1C2C4+C1C3C4+C2C3C4)/(\omega C1C2C3C4)$$

$$R21>(C2C3C4+C2C3C5+C2C4C5+C3C4C5)/(\omega C2C3C4C5)$$

$$R22>(C4+C5)/(\omega C4C5)$$

Here, given that R=11=R12=R21=R22=R, C1=C2=C3=C4=C5=2 pF, and the operational frequency is 2 GHz, the inequality that simultaneously satisfies the forgoing four inequalities is expressed as follows:

$$R>4C\hat{}3/\omega C\hat{}4=4/\omega C=160\Omega$$

Therefore, R>160Ω needs to be satisfied. In order that a resistance value is larger than a combined impedance of variable capacitance elements at a frequency that is 1/10 of the operational frequency, R>1600Ω is required.

From the discussion so far, the values of the resistance components R11 and R12 of the first and second bias lines V11, V12 on the input terminal side and the resistance components R21 and R22 of the first and second bias lines V21 and V22 on the output terminal side may be in a range of about several hundred ohms to 100 MΩ.

Figure 7:
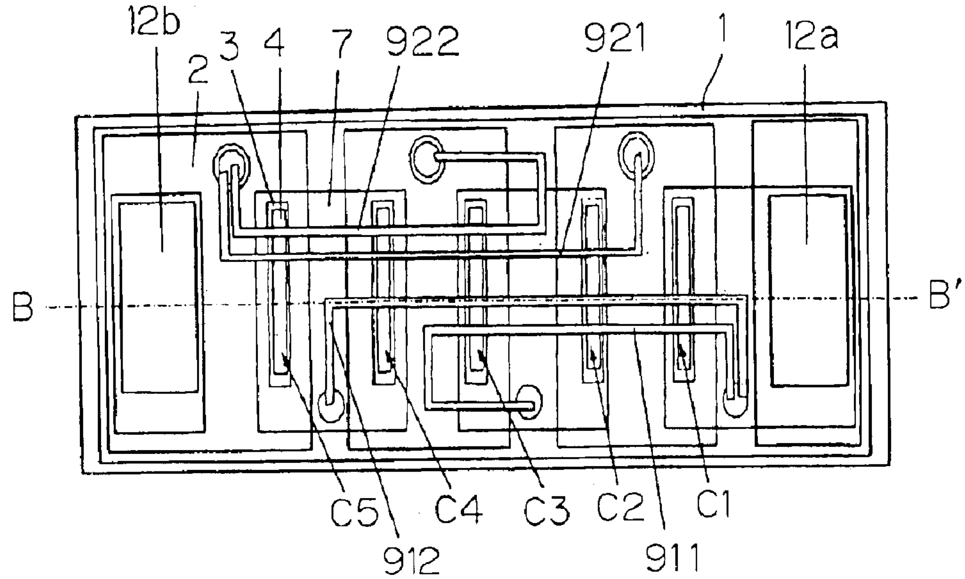
FIG. 7 is a plan view of a variable capacitance thin film capacitor.
Figure 8:
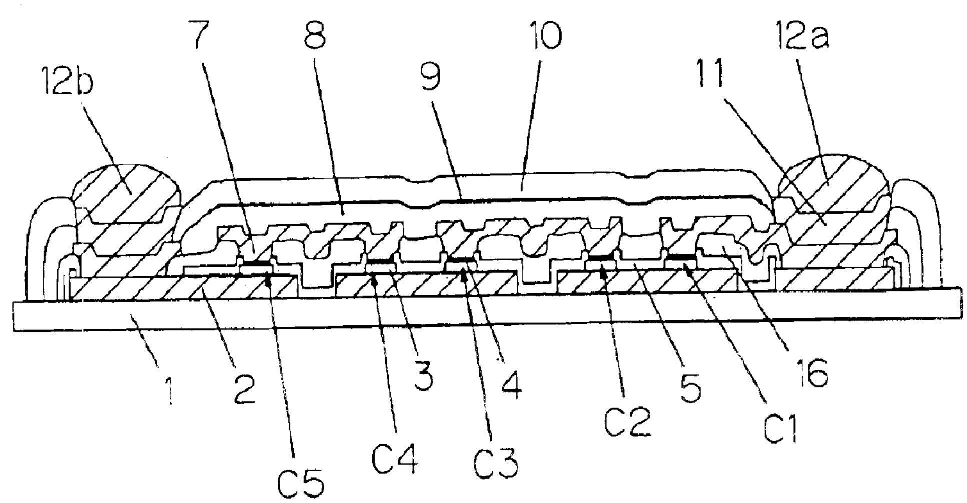
FIG. 8 is a cross-sectional view taken along the line B–B' of FIG. 7.

Referring now to FIGS. 7 and 8, the structure of a variable capacitance thin film capacitor device comprising variable capacitance elements C1–C5 connected in series is described. FIG. 7 is a plan view depicted in phantom to clearly show the arrangement of the films. FIG. 8 shows a cross section taken along a bias line.

This variable capacitance thin film capacitor device has basically the same structure as the variable capacitance thin film capacitor device in FIGS. 3 and 4, except that the number of the variable capacitance elements is increased from 3 to 5.

In FIG. 7 and 8, there are shown a supporting substrate 1, a lower electrode layer 2, a thin film dielectric layer 3, and an upper electrode layer 4. The elements denoted by 16, 7 and 8 are a second insulation layer, an extraction electrode and a third insulating layer, respectively. The elements denoted by 9 are bias lines, where first and second bias lines V11, V12 on the input terminal side are denoted by 911 and 912, and first and second bias lines V21, 22 on the output terminal side are denoted by 921 and 922.

There are also shown a forth insulation layer 10, a solder diffusion barrier layer 11, and solder terminal portions 12*a* and 12*b*, where the terminal portion on the side of input terminal I is denoted by 12*a*, and the terminal portion on the side of output terminal O is denoted by 12*b*.

A first insulation layer 5 is disposed around the thin film dielectric layer 3 and upper electrode layer 4. In the Figures, the elements denoted by C1–C5 are variable capacitance elements whose capacitance components can be varied by bias voltage.

The supporting substrate 1 is a ceramic substrate comprising alumina or the like, or a monocrystal substrate of sapphire or the like. The lower electrode layer 2 is deposited on the surface of the supporting substrate 1. The lower electrode layer 2, thin film dielectric layer 3 and upper electrode layer 4*a* are formed over the entire surface of the supporting substrate 1 by sputtering in the same batch. After deposition of all the layers is finished, the thin film dielectric layer 3 and the upper electrode layer 4 are first physically etched into the same pattern using a resist film with a predetermined pattern. Then, the lower electrode layer 2 is physically or chemically etched using a resist with a predetermined pattern.

Since sputtering at a high temperature is required for the formation of the thin film dielectric layer 3, the material for the lower electrode layer 2 is preferably Pt, Pd or the like which has a high melting point and is precious metal. The lower electrode layer 2 is formed under a condition where the substrate temperature is 150–600° C. Then, the lower electrode layer is heated to a temperature for the sputtering of the thin film dielectric layer 3, which is 700–900° C., and held for a set period of time until the start of the sputtering. This annealing treatment forms the lower electrode layer into a flattened thin film.

The thickness of the lower electrode layer 2 is determined taking the following into consideration: the resistance component in the area from the terminal portion 12*b*, for example, to the third variable capacitance element C3; continuity of the lower electrode layer 2 (Larger thickness is preferred for both cases); and adhesion to the supporting substrate 1 (A relatively small thickness is preferred). The thickness of the lower electrode layer 2 is specified, for example, as 0.1–10 μm. When the thickness is smaller than 0.1 μm, not only the resistance of the electrode itself becomes great, but also the electrode loses continuity, degrading the reliability. On the other hand, when the thickness is greater than 10 μm, the adhesion reliability between the lower electrode layer and the supporting substrate 1 is lowered, and warpage occurs in the supporting substrate 1.

Metal materials other than the above stated precious metals having high melting points such as Pt and Pd may constitute the lower electrode layer 2 such that a multilayered, alloyed stack is formed using these precious metals and Au, Ag, Cu and the like so as to further lower the resistance.

The thin film dielectric layer 3 is a dielectric layer having a high dielectric constant, which comprises perovskite type oxide crystal grains including at least Ba, Sr and Ti. The thin film dielectric layer 3 is formed on the surface of the lower electrode layer 2. A method for forming the thin film dielectric layer is, for example, sputtering using a dielectric from which perovskite type oxide crystal grains can be obtained as the target, in which, with a substrate temperature of 800° C., sputtering is carried out for a length of time necessary for obtaining the desired thickness. By the sputtering at a high temperature, a thin film dielectric layer 3 with a high dielectric constant, high change ratio, and minimal loss can be obtained without a heat treatment after the sputtering.

The material for the upper electrode layer 4 is preferably Au having a small resistivity for reducing the resistance of the electrode. Also, other materials such as Ag and Cu may be used. To enhance the adhesion to the thin film dielectric layer 3, precious metal with high melting point such as Pt or Pd is preferably used in part. The lower limit of the thickness of the upper electrode layer 4 is determined taking the resistance of the electrode itself into consideration as in the case of the lower electrode layer 2. The upper limit of the thickness is determined taking lowering of the adhesion into consideration. The thickness of the upper electrode 4 is specified as 0.1–10 μm.

In the variable capacitance thin film capacitor device according to the present invention, the lower electrode layer 2, thin film dielectric layer 3 and the upper electrode layer 4 can be deposited by sputtering in the same batch as described above. The film formation can be accomplished without exposure to air up to the upper electrode layer. Accordingly, unwanted oil adhesion or the like is not caused between the lower electrode layer 2 and thin film dielectric layer 3 or between the thin film dielectric layer 3 and the upper electrode layer 4. As a result, the adhesion is greatly improved. Also, infiltration of moisture between the lower electrode layer 2 and thin film dielectric layer 3 and between the thin film dielectric layer 3 and the upper electrode layer 4 can be prevented, so that the moisture resistance can be greatly improved. It is therefore possible to form variable capacitance elements C1–C5 with very stable characteristics.

The aforementioned first insulation layer 5 is formed around the thin film dielectric layer 3 and upper electrode layer 4. Materials used for this layer are ceramics such as $SiO_2$, $Si_3N_4$ and the like. Such an insulation layer 5 is formed on the lower electrode layer 2, upper electrode layer 4 and the supporting substrate 1. Then unnecessary portions are removed by dry etching so that the upper surface of the upper electrode layer 4 and terminal portions of the bias lines 9 are exposed.

Other than the common dry etching process using a resist, the following process may be used. When the insulation layer 5 is formed by sputtering, since the target constituents are released from a certain point on the target in various directions, the target constituents coming from various directions are deposited on a certain point on the supporting substrate 1. However, in the dry etching process, etching is effected by ions accelerated between the parallelly disposed electrodes of the etching device. For this reason, the etching proceeds in a direction perpendicular to the film. The top surface of the upper electrode layer 4 is formed using Au, which has poor adhesion to the insulation layer 5, so that at a point during the etching when the insulation layer 5 on the upper electrode layer 4 and the insulation layer 5 around the layer are completely separated from each other, the insulation layer 5 on the upper electrode layer 4 can be automatically removed. In cases where the insulation layer cannot be removed for some reason, it can be completely removed by ultrasonic cleaning or heating at a temperature of 300° C. or so. In such a process, the size and positioning accuracy of the resist layer are not important, and therefore a resist layer with apertures larger than the upper electrode portions 4 may be used. Similar processing is possible without using a resist at all. Since insulation layer 5 around the upper electrode layer 4 and that around the thin film dielectric layer 3 is etched during the etching, stray capacitance may be caused. Therefore, the thickness of the insulation layer in the initial state is preferably thick.

Meanwhile, the first insulation layer 5 is formed so that at least the solder terminal portions 12*a*, 12*b* and terminal portions at which the bias lines 9 are formed are exposed. To fill gaps among the lower electrode, a second insulation layer 16 is formed using ceramics such as $SiO_2$ or $Si_3N_4$, or an organic material such as BCB (benzocyclobutene), polyimide or the like.

The extraction electrode 7 connects the upper electrode layer 4 to (one of) the terminal portions and the upper electrode layer portions 4 together so as to connect the first variable capacitance element C1 to the terminal portion 12*a* as well as connect the second variable capacitance element C2 and third variable capacitance element C3 together in series and the forth variable capacitance element C4 and the fifth variable capacitance element together in series. Inexpensive, low resistance metals such as Ag and Cu may be used for the extraction electrode 7. The size thereof is determined taking stray capacitance and resistance into consideration.

The third insulation layer 8 is formed so that the solder terminal portions 12 and the terminal portions of the bias lines 9 are exposed. For the insulation layer 8, $SiO_2$, SiN, BCB (benzocyclobutene) and polyimide and the like are preferably used. It may be a multilayer of these materials. This third insulation layer 8 is provided for insulation between the bias lines 9 and the extraction electrode 7.

In the circuit of FIG. 5, the bias lines 9 comprise the first and second bias lines 911 and 912 on the input terminal side that connect the connection point A11 to the connection point B11 and the connection point A12 to the connection point B12, respectively, and the first and second bias lines 921 and 922 on the output terminal side that connect the connection point A21 to the connection point B21 and the connection point A22 to the connection point B22, respectively. The bias lines 911–922 are connected to the lower electrode 2 or the extraction electrode 7 through via holes formed in the first insulation layer 5, second insulation layer 16 and third insulation layer 8.

Since the bias lines 911–922 are intended to have the predetermined resistance components R11–R22, high resistance materials such as Ni—Cr alloys, Fe—Cr—Al alloys, precious metals such as Au and Pt (for thickness control for the adjustment of the resistance components), or ferromagnetic materials such as Ni, Fe and the like may be used for the bias lines. The bias lines 911–922 are disposed, for example, as shown in FIG. 7, over the variable capacitance elements C1–C5 with the insulation layer 8 interposed therebetween. The forth insulation layer 10 has the function of protecting the device from mechanical shocks from the outside, as well as the function to prevent deterioration due to humidity, contamination by chemicals, and oxidation.

The solder diffusion barrier layer 11 is provided to prevent solder from diffusing into the electrodes during reflow.

The solder terminal portions 12*a* and 12*b* are formed by printing solder paste followed by reflow. It is also possible to form bumps of gold or the like by fast bonding of a metal wire and then cutting into a predetermined length.

In the variable capacitance thin film capacitor device fabricated as described above, the variable capacitance elements C1–C5 are connected in series in a radio frequency region, and the variable capacitance elements C1–C5 are connected to the bias lines 911–922 having the resistance components R11, R12, R21 and R22, where the input and output terminals I and O (12*a*, 12*b*) are shared.

The variable capacitance thin film capacitor devices shown in FIG. 1–8 are used as a part of a resonant circuit (capacitance component of a LC resonant circuit) of a radio frequency device, or as a capacitance component for coupling the resonant circuits. Accordingly, by simultaneously forming an inductor utilizing the lower electrode layer, upper electrode layer or extraction electrode layer of the variable capacitance thin film capacitor device, or forming another resonant circuit in a margin area (where there is no variable capacitance thin film capacitor device formed) of the supporting substrate 1, the variable capacitance thin film capacitor can be used as a component of a voltage controlled radio frequency resonant circuit. In addition, it can be used for radio frequency devices, which are composite parts combining the resonant circuits, including a voltage controlled radio frequency filters, voltage controlled matching circuit chips, voltage controlled antenna duplexers and the like.

EXAMPLE 1

Figure 9:
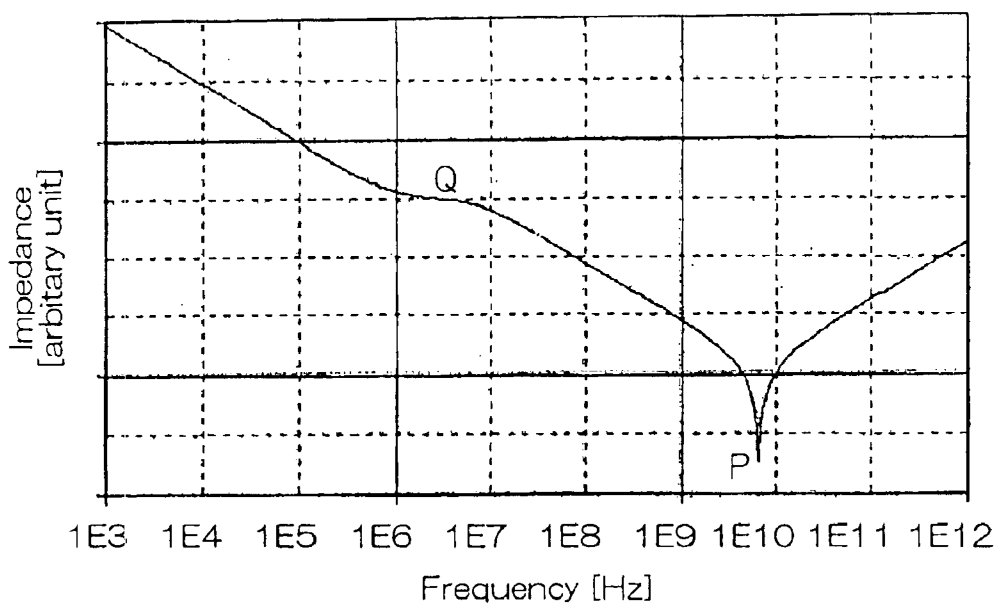
FIG. 9 is a graph showing an impedance characteristic of a variable capacitance circuit according to an example of the present invention.

Variable capacitance elements C1–C3 with a capacitance of 6 pF, a series resistance of 0.1Ω, and a series inductance of 100 pH were connected in series, and bias lines 9 including resistance components R1, R2 with a resistance of 10 kΩ were connected thereto to form a variable capacitance circuit. An impedance characteristic of the circuit is shown in FIG. 9. In FIG. 9, the horizontal axis indicates frequency (log scale) and the vertical axis indicates impedance (relative scale). The tick marks on the horizontal axis indicate frequencies such that IE3 indicates 1*10^3 (kHz), IE6 indicates 1*10^6 (MHz), IE9 indicates 1*10^9 (GHz) etc.

A bottom point P associated with self-resonance of the variable capacitance elements is observed around 6.5 GHz, and an inflection point Q associated with the bias lines 9 is observed around 1.2 MHz. The capacitance of the variable capacitance circuit between these points is 2 pF, which corresponds to the combined capacitance of three variable capacitance elements C1–C3 connected in series. On the side of frequencies lower than the point Q, the capacitance of the variable capacitance circuit is 18 pF, which is the combined capacitance in the case of the variable capacitance elements C1–C3 being connected in parallel. This shows that the variable capacitance elements C1–C3 can be assumed to be connected in series for radio frequency signals between the inflection point Q and the bottom point P. Accordingly, the radio frequency voltage applied to each element of the variable capacitance elements is ⅓ of the total voltage, so that wave distortion due to capacitance change is lessened. The three variable capacitance elements C1–C3 can be assumed to be connected in parallel for frequencies including direct current on the lower frequency side than the inflection point Q. This shows that the capacitance change can be maintained to be large.

EXAMPLE 2

A sapphire R substrate was used as the supporting substrate, on which a lower electrode layer 2 including Pt was formed by sputtering with a substrate temperature of 500° C. A thin film dielectric layer 3 was formed on the lower electrode layer 2 using $(Ba_{0.5}Sr_{0.5})TiO_3$ (BST) as the target, in which the deposition was performed in the same batch with a substrate temperature of 800° C. for 15 minutes. Meanwhile, annealing was performed prior to the start of the film formation at 800° C. for 15 minutes so as to flatten the Pt electrode. On top of the layers, Pt and Au electrode layers were formed in the same batch as the upper electrode layer 4. The specimen was taken out and covered with three columns of a resist film 10 $\mu$m×30 $\mu$m in size, then the upper electrode layer 4 was etched with an ECR device. In the same manner, the BST layer 3 and the lower electrode layer 2 were also etched with the ECR device. Three variable capacitance elements C1–C3 were thus fabricated. After removal of a resist layer, $SiO_2$ layer was deposited by sputtering at 600° C., and then after removal of a resist layer, etching was performed with the ECR device for about 15 minutes to solely remove the $SiO_2$ layer on the upper electrode layer 4. A part of the $SiO_2$ layer that remained on the upper electrode layer 4 was completely removed by ultrasonic cleaning with pure water. In addition, a second insulation layer 8 comprising BCB was formed, on which an extraction electrode layer 7 was formed by sputtering using Ni and Au. Then unnecessary portions were removed by etching. A circuit of the variable capacitance elements C1–C3 connected in series was thus fabricated.

A measurement by an impedance analyzer showed that the capacitance was 2 pF, and the ratio of capacitance change to voltage was about 6% at DC 3V.

After the measurement, an Ni—Cr alloy film was deposited as the bias lines 9, and then unnecessary portions were etched. After the formation of the bias lines 9, a measurement by the impedance analyzer was again performed. As a result, the ratio of capacitance change was about 18% at DC 3V, the capacitance was 18 pF at low frequencies and 2 pF at high frequencies.

It is thus verified that a variable capacitance circuit with a large capacitance change that allows series connection of the capacitance elements at low frequencies and parallel connection of the same at high frequencies can be manufactured.

EXAMPLE 3

Figure 10:
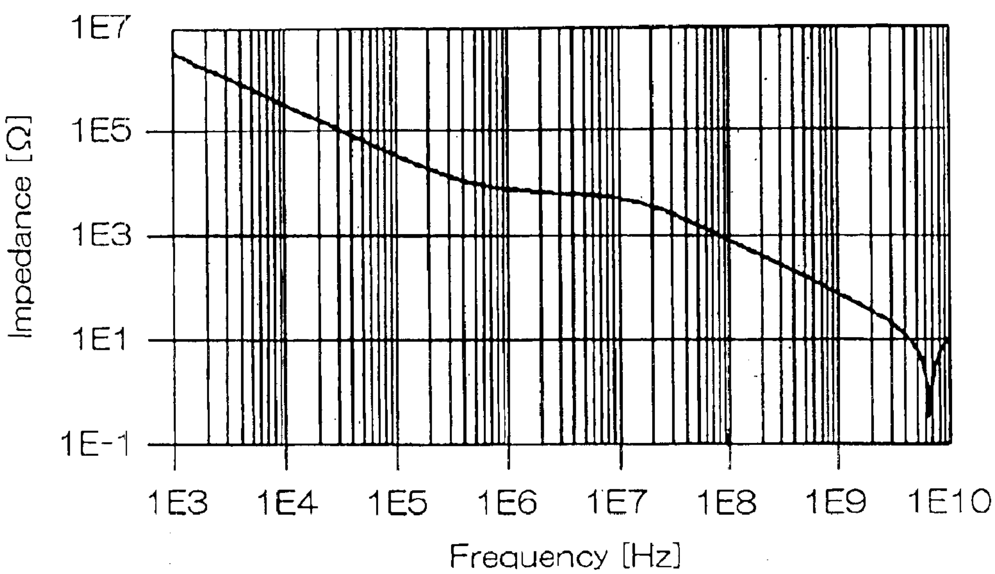
FIG. 10 is a graph showing an impedance characteristic of another variable capacitance circuit according to an example of the present invention.

Variable capacitance elements C1–C5 with a capacitance of 10 pF, a series resistance of 0.06 Ω, and a series inductance of 60 pH were connected in series, and bias lines 9 including resistance components R11, R12, R21 and R22 with a resistance of 10 kΩ were connected thereto to form a variable capacitance circuit. An impedance characteristic of the circuit is shown in FIG. 10.

A bottom point P associated with self-resonance of the variable capacitance elements is observed around 6.5 GHz, and an inflection point associated with the bias lines 9 is observed around 3 MHz. The impedance of the variable capacitance circuit between 3 MHz and 6.5 GHz is almost equal to 2 pF, which is the combined capacitance of the five variable capacitance elements C1–C5 each having a capacitance of 10 pF when connected in series. On the side of frequencies lower than the inflection point at 3 MHz, the impedance of the variable capacitance circuit is almost equal to 50 pF, which is the combined capacitance in the case of the variable capacitance elements C1–C5 being connected in parallel.

This shows that the variable capacitance elements C1–C5 are connected in series for radio frequency signals between the inflection point and the self-resonant frequency, so that the radio frequency voltage applied to each element of the variable capacitance elements is ⅕. As a result, waveform distortion due to capacitance change is lessened. The variable capacitance elements C1–C5 are connected in parallel at frequencies including direct current that are lower than the frequency at the inflection point. This shows that the capacitance change can be maintained to be large.

EXAMPLE 4

A sapphire R substrate was used as the supporting substrate, on which a lower electrode layer 2 including Pt was formed by sputtering with a substrate temperature of 500° C. A thin film dielectric layer 3 was deposited on the lower electrode layer 2 using $(Ba_{0.5}Sr_{0.5})TiO_3$ (BST) as the target, in which the deposition was performed in the same batch with a substrate temperature of 800° C. for 15 minutes. Meanwhile, annealing was performed prior to the start of the film formation at 800° C. for 15 minutes so as to flatten the Pt electrode. On top of the layers, Pt and Au electrode layers were formed in the same batch as the upper electrode layer 4. The specimen was taken out and covered with five columns of a resist film 10 $\mu$m×50 $\mu$m in size, then the upper electrode layer 4 was etched with an ECR device. The BST layer 3 and the lower electrode layer 2 were also etched with the ECR device. Five variable capacitance elements C1–C5 were thus fabricated. After removal of a resist layer, $SiO_2$ layer was deposited by sputtering at 600° C., and then after removal of a resist layer, etching was performed with the ECR device for about 15 minutes to solely remove the $SiO_2$ layer on the upper electrode layer 4. A part of the $SiO_2$ layer that remained on the upper electrode layer 4 was completely removed by ultrasonic cleaning with pure water. In addition, a second insulation layer 8 comprising BCB was formed, and further, an extraction electrode layer 7 was deposited by sputtering using Ni and Au. Then unnecessary portions were removed by etching. A circuit comprising the five variable capacitance elements C1–C5 connected in series was thus fabricated.

A measurement by an impedance analyzer showed that the capacitance was 2 pF, and the ratio of capacitance change was about 4% at DC 3V.

After the measurement, an Ni—Cr alloy film was deposited as the bias lines 9, and then unnecessary portions were etched. After the formation of the bias lines 9, a measurement by the impedance analyzer was again performed. As a result, the ratio of capacitance change was about 20% at DC 3V, the capacitance was 50 pF at low frequencies and 2 pF at high frequencies. It is thus verified that a variable capacitance circuit with a large capacitance change that allows series connection of the capacitance elements at low frequencies and parallel connection of the same at high frequencies can be manufactured.

Second Embodiment

A second embodiment of the present invention will be described below. The second embodiment of the invention comprises bias lines that are formed directly on a supporting substrate.

Figure 11:
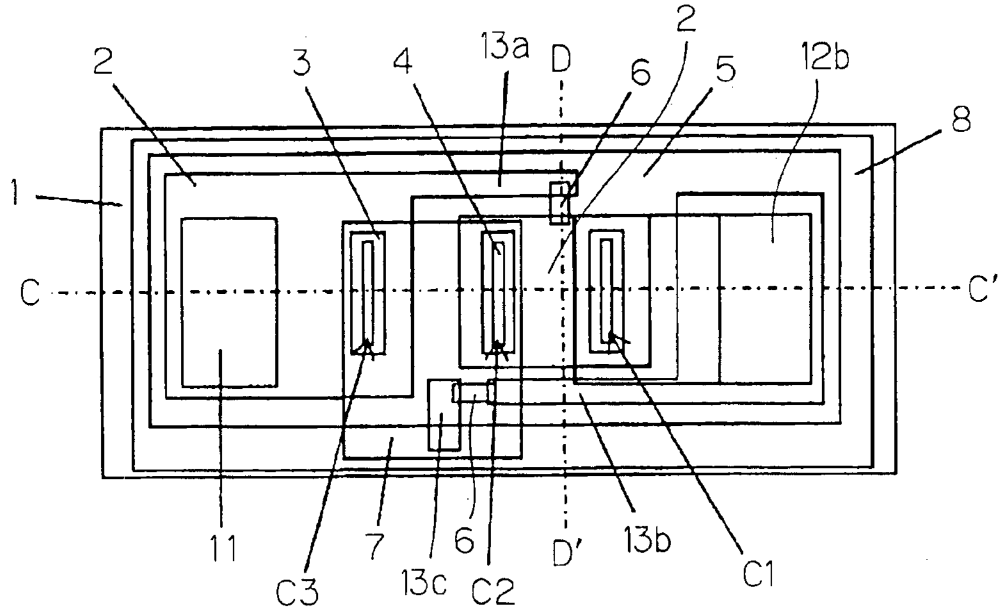
FIG. 11 is a plan view of variable capacitance thin film capacitor according to a second embodiment of the present invention.
Figure 12:
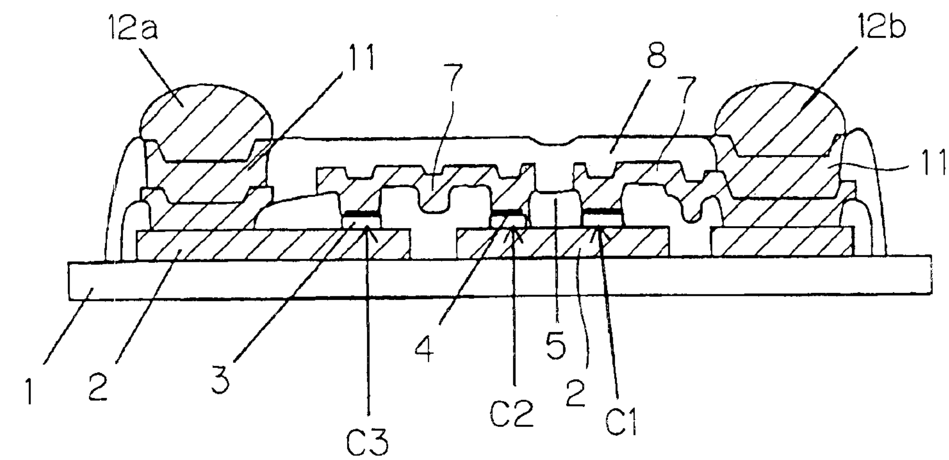
FIG. 12 is a cross-sectional view taken along the line C–C' of FIG. 11.
Figure 13:
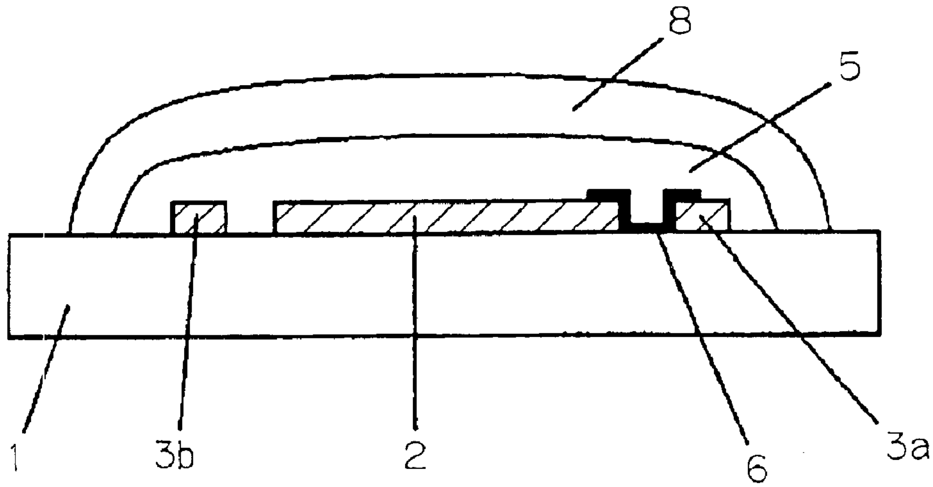
FIG. 13 is a cross-sectional view taken along the line D–D' in FIG. 11.

FIGS. 11, 12 and 13 illustrate the structure of a variable capacitance thin film capacitor according to the present invention, wherein FIG. 11 is a plan view depicted in phantom, FIG. 12 is a cross-sectional view taken along the line C–C' of FIG. 11, and FIG. 13 is a cross-sectional view taken along the line D–D' of the same.

In FIGS. 11, 12 and 13, there are shown a supporting substrate 1, a lower electrode layer 2, a thin film dielectric layer 3, an upper electrode layer 4 formed on the thin film dielectric layer 3, an upper electrode 7 where an extraction electrode layer is provided, an insulation layer 8, a solder diffusion barrier layer 11, solder terminal portions 12*a*, 12*b*, and conductor lines 13*a*–13*c*.

The solder diffusion barrier layer 11 and solder terminal portions 12*a* and 12*b* constitute input and output terminals. In FIG. 11, the symbols C1–C3 denote variable capacitance elements including dielectric layers 3 whose capacitances are changed by bias voltage.

The supporting substrate 1 is a ceramic substrate comprising alumina or the like, or a monocrystal substrate of sapphire or the like.

In the manufacture of the variable capacitance thin film capacitor, the lower electrode layer 2, thin film dielectric layer 3, and upper electrode layer 4 are successively stacked on the entire surface of the supporting substrate 1. After completion of the formation of all of the films, the upper electrode layer 4, thin film dielectric layer 3 and lower electrode layer 2 are successively etched into predetermined patterns.

Since sputtering at a high temperature is required for the deposition of the thin film dielectric layer 3, the material for the lower electrode layer 2 needs to have a high melting point. Namely, it is Pt, Pd or the like. After the sputtering of the lower electrode layer 2, by heating the lower electrode layer 2 to a temperature for the sputtering of the thin film dielectric layer 3, which is 700–900° C., and holding it for a set period of time until the start of the sputtering of the thin film dielectric layer 3, the lower electrode layer 2 becomes a flattened thin film.

The thickness of the lower electrode layer 2 is preferably large when taking the following into consideration: the resistance component in the line from the output terminal (solder terminals 12*a*, 12*b*, solder diffusion barrier layer 11) to the third variable capacitance element C3; and continuity of the lower electrode layer 2. However, when adhesion to the supporting substrate 1 is taken into consideration, a relatively thin lower electrode layer 2 is preferred. The thickness is determined taking the both aspects into consideration. Specifically, the thickness of the lower electrode layer 2 is 0.1–10 μm. When the thickness is smaller than 0.1 μm, not only the resistance of the electrode itself becomes great, but also continuity of the electrode may not be maintained. On the other hand, when the thickness is greater than 10 μm, the adhesion to the supporting substrate 1 may be weakened, and warpage may occur in the supporting substrate 1.

The thin film dielectric layer 3 is a dielectric layer having a high dielectric constant, which comprises perovskite type oxide crystal grains including at least Ba, Sr and Ti. The thin film dielectric layer 3 is formed on the surface of the lower electrode layer 2. With a dielectric from which perovskite type oxide crystal grains can be obtained being situated as the target, sputtering is carried out for a length of time necessary for obtaining the desired thickness. By carrying out the sputtering with a high substrate temperature, for example, 800° C., a thin film dielectric layer 3 with a high dielectric constant, high change ratio, and minimal loss can be obtained without a heat treatment after the sputtering.

The material for the upper electrode layer 4 is preferably Au having a small resistivity for reducing the resistance of the electrode. It is more preferable to use Pt or the like as an adhesive layer so as to enhance the adhesion to the thin film dielectric layer 3. The thickness of the upper electrode layer 4 is preferably 0.1–10 μm. The lower limit of the thickness is determined taking the resistance of the electrode itself into consideration as in the case of the lower electrode layer 2. The upper limit of the thickness is determined taking the adhesion into consideration.

The first bias line V1 comprises the conductor lines 13*b*, 13*c* and a thin film resistor 6 as shown in FIG. 11, and is provided between the input terminal (solder terminal 12*b*, solder diffusion barrier layer 11) of the first variable capacitance element C1 and a connection point between the second variable capacitance element C2 and the third variable capacitance element C3, that is, the extraction electrode 7 connecting the upper electrode layer 4 of the second variable capacitance element C2 and the upper electrode layer 4 of the third variable capacitance C3.

The second bias line V2 comprises the conductor line 13*a* and a thin film resistor 6 as shown in FIG. 11, and is provided between a connection point between the first variable capacitance element C1 and the second variable capacitance element C2, that is, the lower electrode layer 2 shared by the first and second variable capacitance elements C1, C2 and the output terminal (solder terminal 12*a*, solder diffusion barrier layer 11), which is the output terminal portion of the third variable capacitance element C3.

The conductor lines 13*a*, 13*b* and 13*c* can be provided by another film formation after the formation of the lower electrode layer 2, thin film dielectric layer 3 and upper electrode layer 4. For the formation of the conductor lines, the lift off process is preferably used. Alternatively, the conductor lines can be patterned into the desired geometry during the patterning of the lower electrode layer 2.

The material for the conductor lines 13*a*, 13*b* and 13*c* is preferably Au because of its low resistance so that difference in resistance value between the bias lines V1 and V2 is minimized. However, if the resistance of the thin film resistor 6 is adequately high, the same material as the lower electrode layer 2 such as Pt may be used to form the conductor lines in the same process.

A description is now given of the thin film resistor 6 constituting a part of the first and second bias lines V1, V2. In view of high resistivity and stability, tantalum nitride is suitably used for the thin film resistor 6. Tantalum nitride is produced by reactive sputtering in which sputtering is performed with Ta as the target in the presence of nitrogen. This enables formation of a film with desired composition ratio and resistivity. The film thickness is determined taking sheet resistance into account, and there is no limitation on the thickness so long as the desired resistance value can be obtained. It's patterning can be readily performed by dry etching such as reactive ion etching (RIE) after application of a resist in the predetermined pattern after the sputtering.

Meanwhile, the bias lines maybe constructed, for example, only with the thin film resistors 6 with a predetermined geometry without using the conductor lines 13*a*, 13*b* and 13*c*. In such a case, materials other than tantalum nitride including a high resistance alloy such as Ni—Cr alloy, a precious metal such as Au, Pt or the like, a ferromagnetic material such as Ni, Fe or the like may also be used while controlling the thickness.

The bias lines V1 and V2 including the thin film resistors 6 are formed directly on the supporting substrate 1 in the second embodiment of the present invention. By this arrangement, it becomes unnecessary to form an insulation layer for providing insulation between the lines and the lower electrode layer 2, upper electrode layer 4 and the extraction electrode layer 7, which is required when forming bias lines over the elements. Accordingly, the number of layers constituting the device can be reduced. The use of the high resistance thin film resistors enables fabrication of the device with no increase in size.

Because the circuit diagram of the variable capacitance thin film capacitor circuit according to the second embodiment of the invention is the same as that of FIG. 1, the drawing thereof is not shown.

Figure 14:
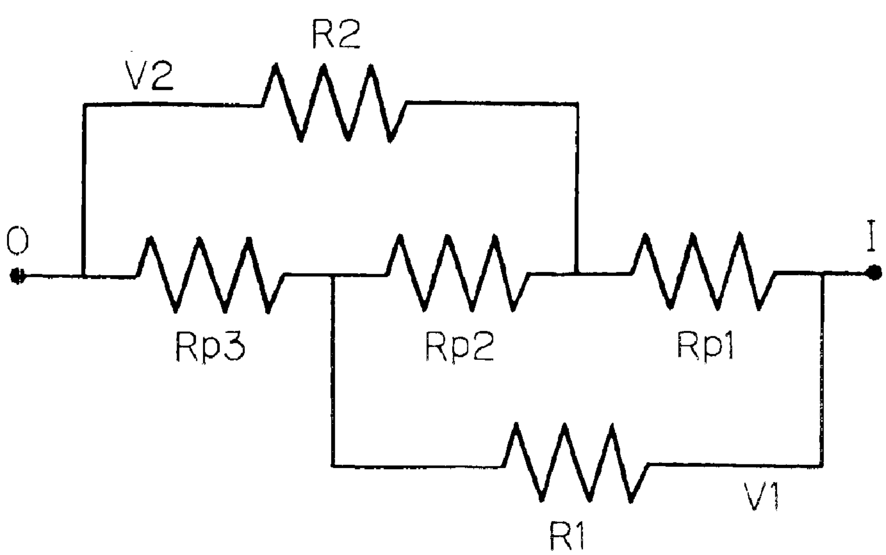
FIG. 14 shows a DC equivalent circuit where the capacitance elements of the variable capacitance thin film capacitor are replaced with resistance components.

An equivalent circuit diagram is shown in FIG. 14. This equivalent circuit diagram is also similar to FIG. 2, and shows a DC equivalent circuit where the variable capacitance elements C1–C3 are replaced with insulation resistances Rp1, Rp2 and Rp3. The resistances of the bias lines V1, V2 are represented by R1 and R2, respectively. The resistances R1 and R2 include the resistances of thin film resistors 6. The input side of the terminal portions is denoted by I, and the output side thereof is denoted by O.

The resistances R1, R2 are determined such that a voltage applied to one of the variable capacitance elements C1–C3 when the bias lines V1 and V2 are not present is smaller than a voltage, which is a voltage dropped by the bias lines V1 and V2, applied to one of the variable capacitance elements C1–C3 when the bias lines V1, V2 are present.

Concerning the variable capacitance element C1, the following inequality needs to be satisfied:

$$Rp1/(R2+Rp1)>Rp1/(Rp1+Rp2+Rp3)$$

This is transformed into:

$$R2<Rp2+Rp3$$

The value of R2 is determined so as to satisfy the inequality above.

Likewise, concerning the variable capacitance element C2, the following inequality needs to be satisfied:

$$Rp2/(R1+R2+Rp2)>Rp2/(Rp1+Rp2+Rp3)$$

This is transformed into:

$$R1+R2<Rp1+Rp3$$

Therefore, the values of R1, R2 are determined so as to satisfy the inequality above.

Likewise, concerning the variable capacitance element C3, the following inequality needs to be satisfied:

$$Rp3/(R1+Rp3)>Rp3/(Rp1+Rp2+Rp3)$$

This is transformed into:

$$R1<Rp2+Rp3$$

Therefore, the value of R1 is determined so as to satisfy the inequality above.

Assume that R1=R2=R, Rp1=Rp2=Rp3=Rp=1 GΩ. Then, R<1 GΩ is found to be a prerequisite.

Incidentally, when a resistance value at which a bias voltage applied to the variable capacitance elements C1–C3 is 1/10 of that in the previous case is assumed to be the upper limit, R<100 MΩ needs to be satisfied.

If the quadruple of the time constant is required to be smaller than a required response time T, $$T>4*2*RC$$

This is transformed into:

$$R<T/8C$$

Given that response time T=10 μs, and capacity C=2 pF, the following is obtained:

$$R<10*10\exp-6/8*2*10\exp-12=625\ k\Omega$$

If the response time can be on the order of milliseconds, the upper limit of R is 62 MΩ or so.

Now, the lower limit values of R1, R2 are discussed. At an operational frequency ω, the combined impedance of (C1+C2) needs to be smaller than R1, and the combined impedance of (C2+C3) needs to be smaller than R2 in the series connected variable capacitance elements C1–C3. If this is satisfied, the frequency at which the combined impedance of (C1+C2) equals to R1 is smaller than the operational frequency, and the frequency at which the combined impedance of (C2+C3) equals to R2 is smaller than the operational frequency. That is, the following inequities are satisfied:

$$R1>(C1+C2)/(\omega C1C2)$$

$$R2>(C2+C3)/(\omega C2C3)$$

Given that R1=R2=R, C1=C2=C3=C=2 pF, and the operational frequency is 2 GH, R needs to satisfy the following:

$$R>2C/\omega C\hat{}2=2/\omega C=80\ \Omega$$

To satisfy the forgoing condition at a frequency that is 1/10 of the operational frequency, satisfying R>800Ω is necessary.

From the discussion above, the resistance of the bias lines including the thin film resistors 6 may be in a range of about several hundred ohms to 100 MΩ.

The insulation layer 5 is necessary for providing insulation between the extraction electrode 7 formed thereon and the lower electrode layer 2. There is no particular limitation on the material for the insulation layer 5 so long as it has high insulation performance such as resin, $SiO_2$, $Si_3N_4$ or the like. However, in view of improving the moisture resistance of the device, using $SiO_2$ or $Si_3N_4$ is preferable. Preferably, taking the coatability into account, these are formed into a layer by chemical vapor deposition (CVD) or the like.

The insulation layer 5 can be formed into a desired shape by the common dry etching that uses resist. However, it is necessary for the conductor line 13*c* to be partially exposed for ensuring connection between the thin film resistor 6 and the extraction electrode layer 7. Additionally, it is preferable that the upper electrode portions and the solder terminal portions be solely exposed in view of improving the moisture resistance.

The extraction electrode layer 7 is a layer that connects the upper electrode layer 4 to one of the terminal portions (i.e., 12*b* in FIG. 12) and the upper electrode layer portions 4 to each other. Preferably, a low resistance metal such as Au, Cu or the like is used as the material. It is also possible to use an adhesive layer of Ti or Ni for a part of the extraction electrode 7 taking the adhesion to the insulation layer 5 into account.

The lower electrode layer 2 that bridges C1 to C2 is connected to the conductor line 13*a* at outside of the insulation layer 5.

The protective layer 8 is provided for mechanically protecting the device from the outside and contamination by chemicals. The layer is formed so that the terminal portions 12*a* and 12*b* are exposed. Materials with high thermal resistance and good gap filling performance are preferred for this layer, namely, polyimide, BCB (benzocyclobutene) resin etc.

The solder diffusion barrier layer 11 is provided to prevent solder from diffusing into the electrodes during reflow in the formation of solder terminals and mounting. Ni is preferably used as the material. Occasionally, Au or Cu that has an excellent solder wettability is used to form a film about 0.1 μm in thickness on the surface of the solder diffusion barrier layer 11 so as to improve the solder wettability.

In the last step, the solder terminal portions 12*a* and 12*b* are formed. They are formed to facilitate the mounting. Generally, printing solder paste followed by reflow is carried out.

In the variable capacitance thin film capacitor described above, the variable capacitance elements C1–C3 are connected in series in a radio frequency region, and with the bias lines having resistances determined mainly by the thin film resistors 6, the variable capacitance elements C1–C3 are connected in parallel in a direct current region.

In addition, by forming the bias lines directly on the supporting substrate 1, the number of layers constituting the device is reduced.

The foregoing variable capacitance thin film capacitor is used as a part of a resonant circuit (capacitance component of a LC resonant circuit) of a radio frequency device, or as a capacitance component for coupling the resonant circuits. Accordingly, by simultaneously forming an inductor utilizing the lower electrode layer, upper electrode layer or extraction electrode layer of the variable capacitance thin film capacitor device, or forming another resonant circuit in a margin area (where there is no variable capacitance thin film capacitor device formed) of the supporting substrate 1, the variable capacitance thin film capacitor can be used as a component of a voltage controlled radio frequency resonant circuit. In addition, it can be used for radio frequency devices, which are composite parts combining the resonant circuits, including voltage controlled radio frequency filters, voltage controlled matching circuit chips, voltage controlled antenna duplexers and the like.

EXAMPLE 5

A sapphire R substrate was used as the supporting substrate, on which a lower electrode layer 2 comprising Pt was deposited by sputtering with a substrate temperature of 500° C. A thin film dielectric layer 3 was deposited using $(Ba_{0.5}Sr_{0.5})TiO_3$ (BST) as the target, in which the deposition was performed in the same batch with a substrate temperature of 800° C. for 15 minutes. Meanwhile, annealing was performed prior to the start of the deposition at 800° C. for 15 minutes so as to flatten the Pt electrode. On top of the layers, as the upper electrode layer 4, Pt and Au electrode layers were deposited in the same batch. Then, after a resist was applied and formed into a predetermined pattern by photolithography, the upper electrode layer 4 was etched with an ECR device. Thereafter, the BST layer 3 and the lower electrode layer 2 were also etched with the ECR device. The geometry of the lower electrode layer 2 was designed to include the conductor lines 3*a*–3*c*.

Subsequently, tantalum nitride was deposited as the thin film resistors 6 by sputtering at 100° C. After the sputtering, a resist was applied and formed into a predetermined pattern by photolithography, and then etching with the RIE device was performed to remove the resist film.

Subsequently, a $SiO_2$ film was deposited as the insulation layer 5 in a CVD device using a TEOS gas. Then after a resist was patterned, the film was etched into a predetermined pattern by RIE.

Thereafter, as the extraction electrode layer 7, Ni and Au were deposited by sputtering and formed into a predetermined pattern.

Lastly, the protective layer 8, solder diffusion barrier layer 11, solder terminals 12*a* and 12*b* were successively formed. A polyimide resin was used for the protective layer 8, and Ni was used for the solder diffusion barrier layer 11.

Additionally, the resistance of the thin film resistors was measured to be about 100 kΩ.

Figure 15:
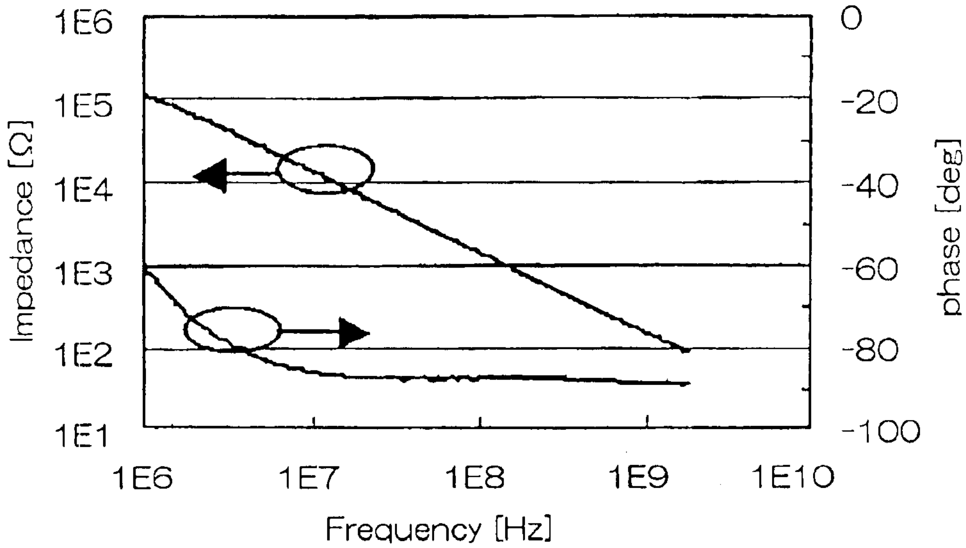
FIG. 15 is a graph showing impedance and phase characteristics of a variable capacitance thin film capacitor.

A measurement of the variable capacitance thin film capacitor obtained in the aforementioned way was performed with an impedance analyzer, the result of which is shown in FIG. 15. In the characteristic graph, the notation is such that 1E1 indicates 1*10^1 (i.e., 10), 1E3 indicates 1*10^3, 1E6 indicates 1*10^6, and so forth.

FIG. 15 shows that an influence of the bias lines is observed around 1.0 MHz, while no influence is observed at the radio frequency region.

Figure 16:
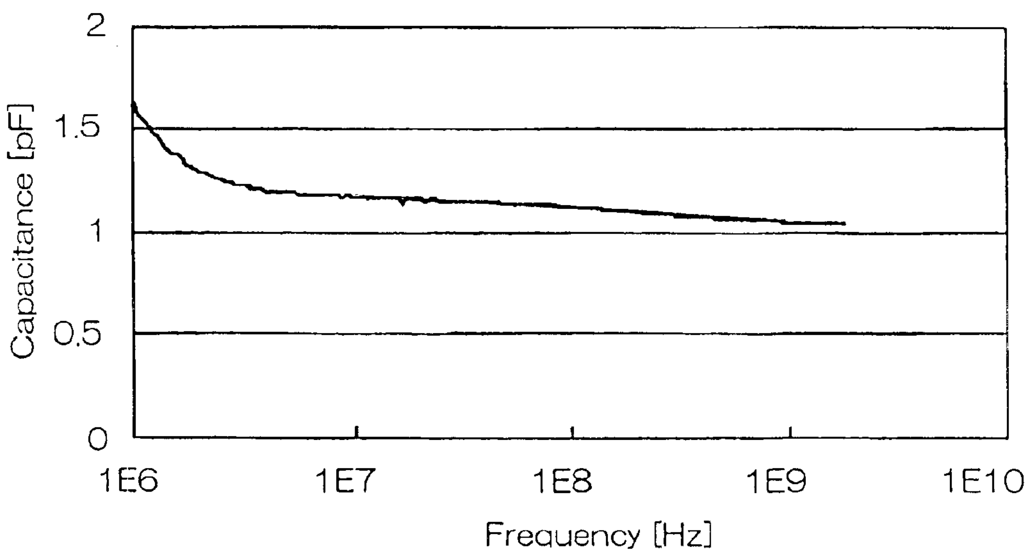
FIG. 16 is a graph showing a capacitance characteristic of a variable capacitance thin film capacitor.

FIG. 16 shows the dependence of the capacitance on the frequency. An increase of the capacitance due to the influence of the bias lines is observed around 1.0 MHz, while the capacitance is about 1 pF in the radio frequency region. The ratio of capacitance change is about 20% at DC 3V.

COMPARATIVE EXAMPLE 1

Figure 17:
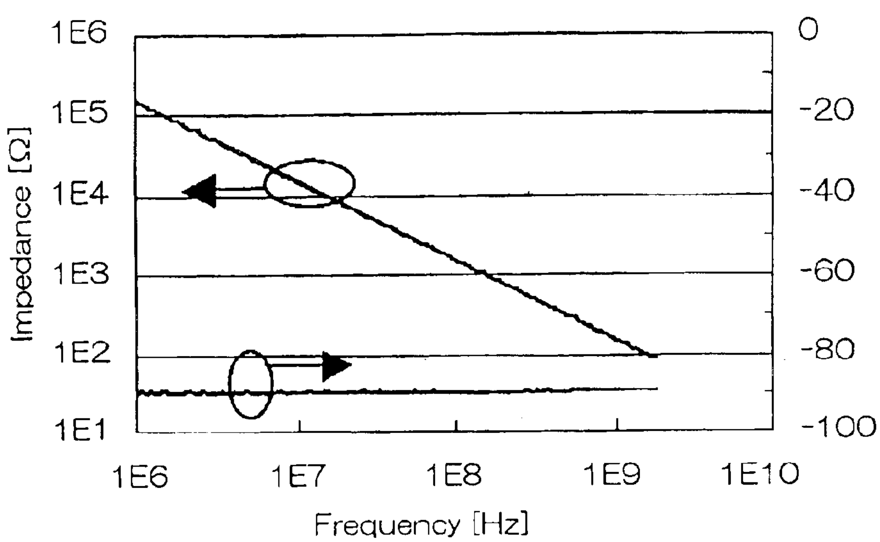
FIG. 17 is a graph showing impedance and phase characteristics of a comparative example.

As a comparative example, a variable capacitance thin film capacitor device was fabricated with essentially the same structure as the forgoing example, except that the bias lines V1, V2 were not provided. The result of a measurement of the variable capacitance thin film capacitor device with the impedance analyzer is shown in FIG. 17. Because of the absence of the bias lines, the phase is almost constant at −90 degrees.

Figure 18:
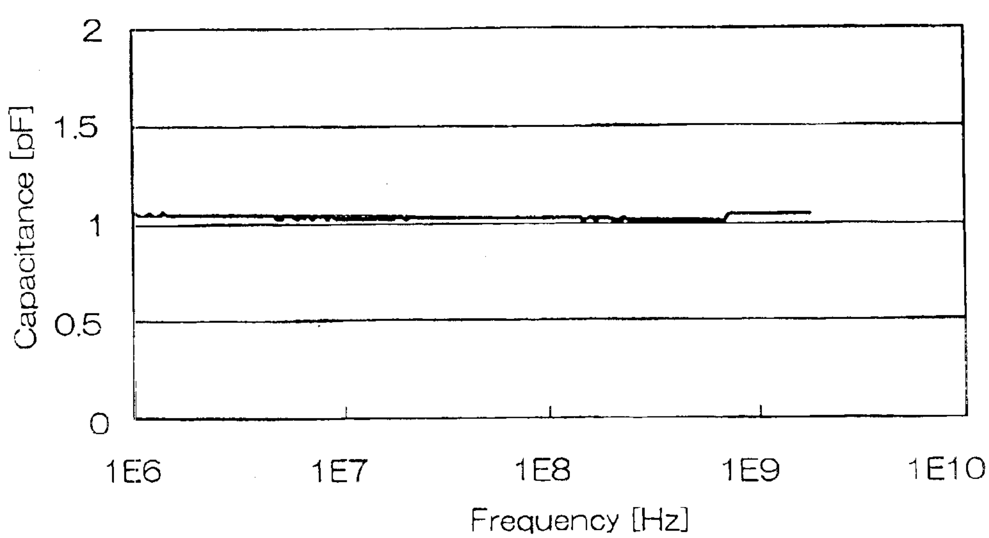
FIG. 18 is a graph showing a capacitance characteristic of the comparative example.

The dependence of the capacitance on the frequency is shown in FIG. 18. The capacitance is about 1 pF even around 1.0 MHz. The ratio of capacitance change at DC 3V is 6%. The DC bias voltage necessary for obtaining the same capacitance change ratio as in the example is 18 V.

The results obtained from the example and comparative example show that a variable capacitance thin film capacitor which allows the capacitance elements to be connected in parallel in a direct current region and in series in a radio frequency region can be obtained by the present invention. By forming the bias lines directly on the supporting substrate and using high resistance thin film resistors, the number of layers can be reduced, and the characteristics and reliability are improved without increasing the device size.

While a variable capacitance circuit having three variable capacitance elements C1–C3 (first variable capacitance element C1, second variable capacitance element C2 and third variable capacitance element C3) connected in series has been described so far, generally, the present invention is applicable to variable capacitance circuits having N (N is an integer not smaller than 3) variable capacitance elements.

Figure 19:
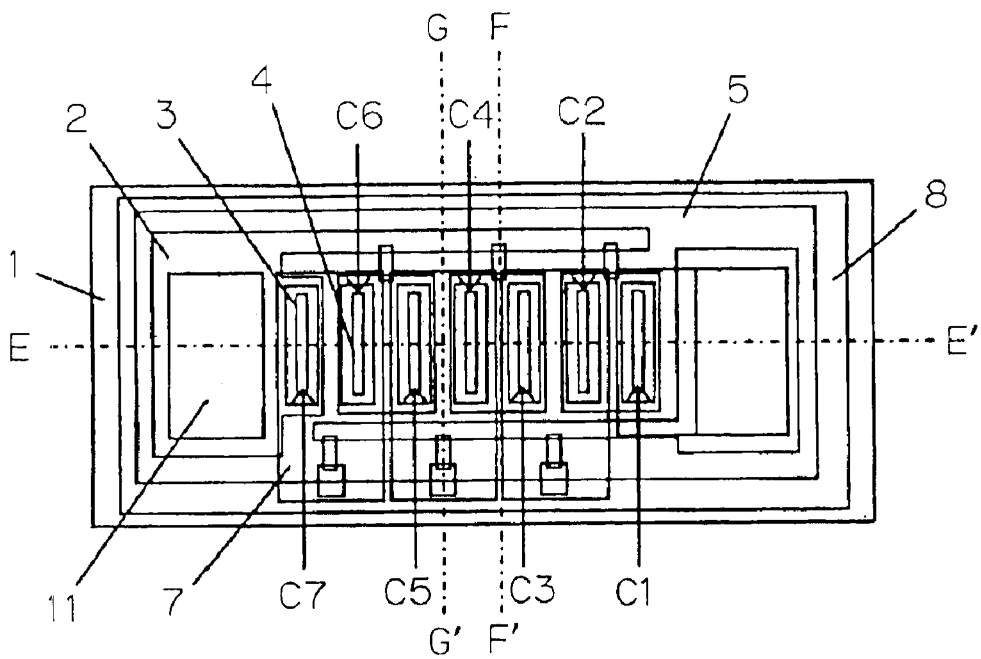
FIG. 19 is a plan view of another variable capacitance thin film capacitor according to the second embodiment.
Figure 20:
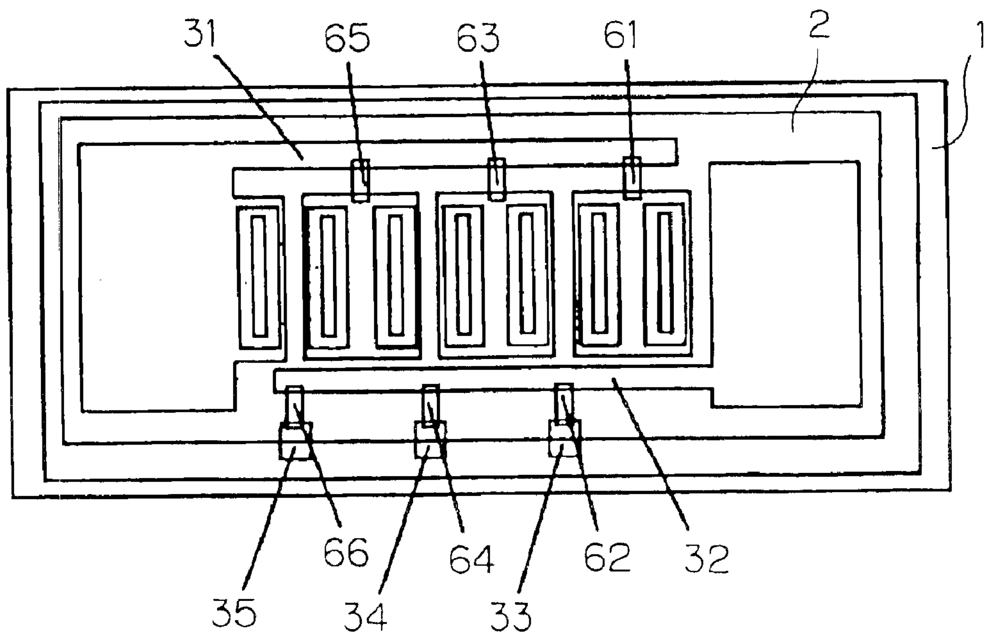
FIG. 20 is a plan view of the variable capacitance thin film capacitor at an intermediate stage of its manufacture.
Figure 21:
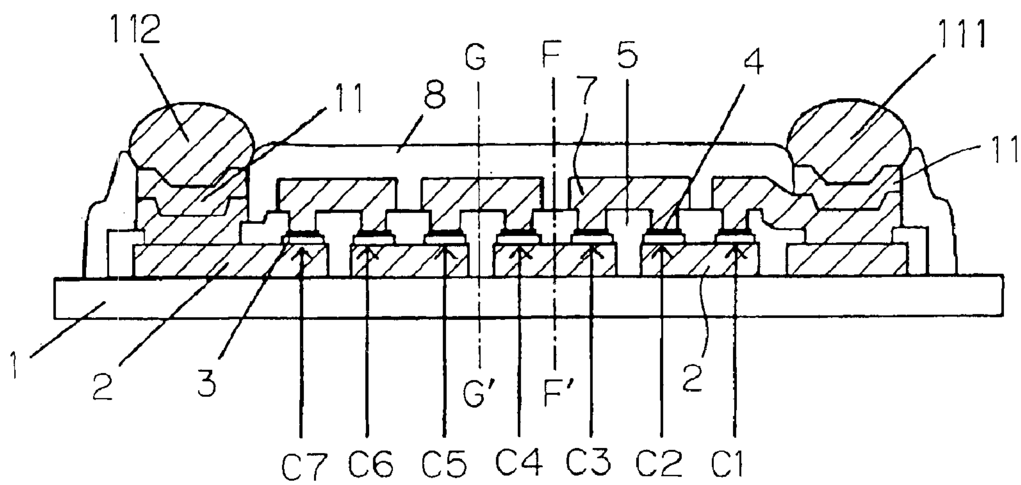
FIG. 21 is a cross-sectional view taken along the line E–E' of FIG. 19.
Figure 22:
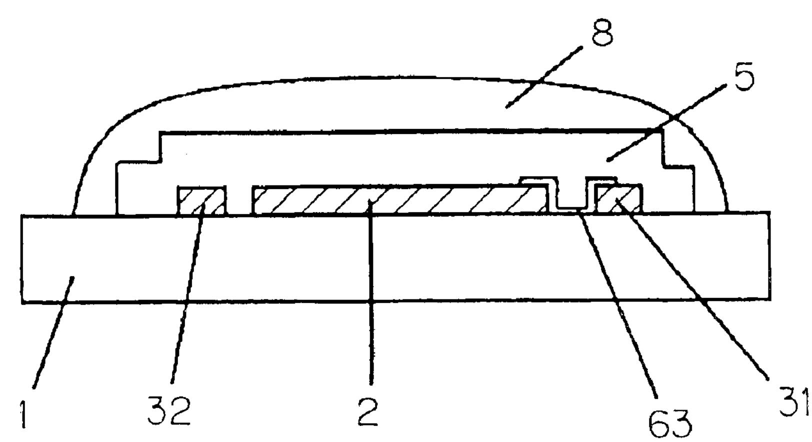
FIG. 22 is a cross-sectional view taken along the line F–F' of FIG. 19.
Figure 23:
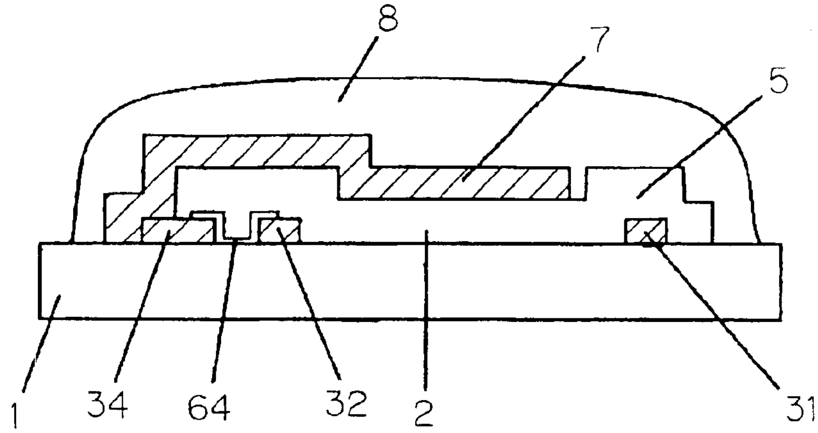
FIG. 23 is a cross-sectional view taken along the line G–G' of FIG. 19.

A variable capacitance circuit where N=7 will be described below. FIG. 19 is a plan view of the variable capacitance circuit depicted in phantom. FIG. 20 is a plan view showing the circuit at an intermediate stage of the manufacture, and FIG. 21 is a cross-sectional view taken along the line E–E' of FIG. 19. FIG. 22 is a cross-sectional view taken along the line F–F' of FIG. 19, and FIG. 23 is a cross-sectional view taken along the ling G–G' of FIG. 19.

In FIGS. 19–23, there are shown a supporting substrate 1, a lower electrode layer 2, conductor lines 31, 32, 33,34, and 35, thin film dielectric layer 3, an upper electrode layer 4 provided on the thin film dielectric layer 4, and a layer serving as an upper electrode and an extraction electrode 7. Also, there are shown thin film resistors 61,62, 63, 64, 65 and 66, an insulation layer covering the extraction electrode 7, a solder diffusion barrier layer 11, and solder terminal portions 111 and 112. The solder diffusion barrier layer 11 and solder terminal portions 111, 112 constitute input and output terminals. In FIGS. 19 and 21, the symbols C1–C7 denote variable capacitance elements whose capacitances are varied by bias voltage.

The supporting substrate 1 is a ceramic substrate of alumina or the like, or a monocrystal substrate of sapphire or the like. The lower electrode layer 2, thin film dielectric layer 3, and upper electrode layer 4 are successively deposited on the entire surface of the supporting substrate 1. After completion of the deposition of all the layers, the upper electrode layer 4, thin film dielectric layer 3 and lower electrode layer 2 are successively etched into predetermined patterns.

Since sputtering at a high temperature is required for the formation of the thin film dielectric layer 3, the lower electrode layer 2 needs to comprise a material having a high melting point, namely, Pt, Pd or the like. After the deposition of the lower electrode layer 2, the lower electrode layer 2 is heated to a temperature for the sputtering of the thin film dielectric layer 3, which is 700–900° C., and held for a set period of time until the sputtering of the thin film dielectric layer 3 is initiated. The lower electrode layer 2 is thus formed into a flattened thin film.

The thickness of the lower electrode layer 2 is preferably large when taking the following into consideration: resistance component in the path from the output terminal (solder terminal 112, solder diffusion barrier layer 11) to the seventh variable capacitance element C7, in the path from C1 to C2, in the path from C2 to C3, in the path from C3 to C4, in the path from C4 to C5, and in the path from C5 to C6; and continuity of the lower electrode layer 2. However, when adhesion to the supporting substrate 1 is taken into consideration, a relatively thin lower electrode layer 2 is preferred. The thickness is determined taking the both aspects into consideration. Specifically, the thickness of the lower electrode layer 2 is 0.1–10 μm. When the thickness is smaller than 0.1 μm, not only the resistance of the electrode itself becomes great, but also continuity of the electrode may not be maintained, degrading the reliability. On the other hand, when the thickness is greater than 10 μm, the adhesion to the supporting substrate 1 may be weakened, and warpage may occur in the supporting substrate 1.

The thin film dielectric layer 3 is a dielectric layer having a high dielectric constant, which comprises perovskite type oxide crystal grains including at least Ba, Sr and Ti. The thin film dielectric layer 3 is formed on the surface of the lower electrode layer 2. The process for forming the dielectric layer 3 is, for example, as follows: With a dielectric from which perovskite type oxide crystal grains can be obtained being situated as the target, sputtering is carried out at a substrate temperature of 800° C. for a length of time necessary for obtaining the desired thickness. By carrying out the sputtering at such a high substrate temperature, a thin film dielectric layer 3 with a high dielectric constant, high capacitance change ratio, and minimal loss can be obtained without a heat treatment after the sputtering.

The material for the upper electrode layer 4 is preferably Au having a small resistivity for reducing the resistance of the electrode. To enhance the adhesion to the thin film dielectric layer 3, Pt or the like is preferably used as an adhesive layer. The thickness of the upper electrode layer 4 is specified as 0.1–10 μm. The lower limit of the thickness is determined taking the resistance of the electrode itself into consideration as in the case of the lower electrode layer 2. The upper limit of the thickness is determined taking the adhesion into consideration.

A first bias line on the input terminal side comprises the conductor lines 32, 33 and a thin film resistor 62. The first bias line on the input terminal side is provided between the input terminal (solder terminal 12*b*, solder diffusion barrier layer 11) of the first variable capacitance element C1 and a connection point between the second variable capacitance element C2 and the third variable capacitance element C3, that is, the extraction electrode layer 7 connecting the upper electrode layer 4 of the second variable capacitance element C2 and the upper electrode layer 4 of the third variable capacitance element C3.

A second bias line on the input terminal side comprises the conductor lines 32, 34 and a thin film resistor 64. The second bias line on the input terminal side is provided between the input terminal and a connection point between the forth variable capacitance element C4 and the fifth variable capacitance element C5. Similarly, a third bias line on the input terminal side comprises the conductor lines 32, 35 and the thin film resistor 66, and is provided between the input terminal and a connection point between the sixth variable capacitance element C6 and seventh variable capacitance element C7.

A first bias line on the output terminal side comprises the conductor line 31 and the thin film resistor 61, and is provided between a connection point between the first variable capacitance element C1 and the second variable capacitance element C2, that is, the lower electrode layer 2 shared by the variable capacitance elements C1 and C2 and the output terminal (solder terminal 112, solder diffusion barrier layer 11), which is the output terminal portion of the seventh variable capacitance element C7.

A second bias line on the output terminal side comprises the conductor line 31 and the thin film resistor 63, and is provided between a connection point between the third variable capacitance element C3 and the forth variable capacitance element C4 and the output terminal. Likewise, a third bias line on the output terminal side comprises the conductor line 31 and the thin film 65, and is provided between a connection point between the fifth variable capacitance element C5 and the sixth variable capacitance element C6 and the output terminal.

These conductor lines 31, 32, 33, 34 and 35 can be formed separately after the formation of the lower electrode layer 2, thin film dielectric layer 3 and upper electrode layer 4. For the formation of the conductor lines, the lift off process is preferably used. Alternatively, the formation of the conductor lines can be accomplished by patterning into the desired geometry of the conductor lines during the patterning of the lower electrode layer 2.

The material for the conductor lines is preferably Au because of its low resistance so that difference in resistance among the bias lines is minimized. However, since the resistances of the thin film resistors 61–66 are adequately high, the same material as the lower electrode layer 2 such as Pt may be used to form the conductor lines in the same process.

The material for the thin film resistors 61–66 constituting the bias lines comprises tantalum, and its specific resistance is 1 mΩcm or more. Specifically, the material may be tantalum nitride, TaSiN, or Ta—Si—O. For example, when using tantalum nitride, a film with the desired composition ratio and resistivity can be deposited by reactive sputtering in which sputtering is carried out with Ta as the target in the presence of nitride.

By setting the conditions for the sputtering properly, a film with a thickness of 40 nm or more and a specific resistance of 1 mΩcm can be formed. In addition, patterning thereof can be readily carried out such that after a resist is applied and formed into a predetermined pattern after the sputtering, an etching process such as reactive ion etching (RIE) is carried out.

Meanwhile, if the variable capacitance thin film capacitor of the present invention is used at a frequency of 2 GHz and each variable capacitance element C1–C7 has a capacitance of 7 pF, the resistance of the bias lines necessary for the elements C1–C7 to have a DC capacitance effective at a frequency that is 1/10 of the frequency above may be about 1 kΩ or more. Since the specific resistance of the thin film resistors according to the present invention is 1 mΩcm or more, for example, when 10 kΩ is obtained as the resistance of the bias lines, the thin film resistors can have an aspect ratio (length/width) of 50 or less at a film thickness of 50 nm. Thus, the thin film resistors are allowed to have such a lowest possible aspect ratio without increasing the device size.

The bias lines including the thin film resistors 61–66 are formed directly on the supporting substrate 1 in this embodiment. By this arrangement, it becomes unnecessary to form an insulation layer for providing insulation between the lines and the lower electrode layer 2, upper electrode layer 4 and the extraction electrode layer 7, which is required when forming bias lines over the elements. Accordingly, the number of layers constituting the device can be reduced. The use of the high resistance thin film resistors enables fabrication of the device with no increase in size.

The insulation layer 5 is necessary for providing insulation between the extraction electrode 7 formed thereon and the lower electrode layer 2. Since the insulation layer 5 covers the bias lines, and thereby the thin film resistors can be prevented from being oxidized, the resistance of the bias lines can be maintained at a constant value over time, thereby improving the reliability. In view of improving the moisture resistance, the material for the insulation layer 5 comprises at least one kind selected between silicon nitride and silicon oxide. Preferably, taking the coatability into account, these are deposited by chemical vapor deposition (CVD) or the like.

The insulation layer 5 can be formed into a desired pattern by the common dry etching that uses resist. However, it is necessary for the conductor lines 33–35 to be partially exposed for ensuring connection between the thin film resistor 61–66 and the extraction electrode layer 7.

Additionally, it is preferable that the upper electrode portions and the solder terminal portions be solely exposed in view of improving the moisture resistance.

The extraction electrode layer 7 is a layer that connects the upper electrode layer 4 of the first variable capacitance element C1 to one of the terminal portions 111 and the upper electrode layer portions 4 to each other. Specifically, it connects the first variable capacitance element C1 to the terminal portion 111 as well as the second variable capacitance element C2 to the third variable capacitance element C3, the forth variable capacitance element C4 to the fifth variable capacitance element C5, the sixth variable capacitance element C6 to the seventh variable capacitance element C7, and the upper electrode layer portions 4 thereof to each other in series.

In addition, portions of the extraction electrode layer 7 that bridge C2 to C3, C4 to C5, and C6 to C7 are coupled to the conductor lines 33, 34 and 35, respectively, at outside of the insulation layer 5.

Preferably, a low resistance metal such as Au, Cu or the like is used as the material for the extraction electrode layer 7. It is also possible to provide an adhesive layer of Ti or Ni taking the adhesion to the insulation layer 5 into account.

Subsequently, the protective layer 8 is formed. The protective layer 8 is provided for mechanically protecting the device from the outside and contamination by chemicals. The layer is formed so that the terminal portions 111 and 112 are exposed. Materials with high thermal resistance and good gap filling performance are preferred for this layer, namely, resins such as polyimide, BCB (benzocyclobutene), etc. are used.

The solder diffusion barrier layer 11 is provided to prevent solder from diffusing into the electrodes during reflow in forming solder terminals and mounting. Ni is preferably used as the material. Occasionally, Au or Cu that has an excellent solder wettability is used to form a film about 0.1 μm in thickness on the surface of the solder diffusion barrier layer 11 so as to improve the solder wettability.

Lastly, the solder terminal portions 111 and 112 are formed. This is formed to facilitate the mounting. Generally, printing solder paste followed by reflow is carried out.

In the variable capacitance thin film capacitor device described above, the variable capacitance elements C1–C7 are connected in series. In addition, the variable capacitance elements C1–C7 are each connected to the bias lines having resistances that are mainly determined by the thin film resistors 61–66. Because of this arrangement, the variable capacitance elements C1–C7 are connected in series in a radio frequency region, and in parallel in a direct current region.

Because of the bias lines or a part thereof comprising tantalum nitride and the thin film resistors having a specific resistance of 1 mΩcm or more, the aspect ratio of the thin film resistors is reduced, thereby miniaturization of the device is accomplished. Also, by forming the bias lines directly on the supporting substrate, the number of layers constituting the device is reduced.

The foregoing variable capacitance thin film capacitor device is used as a part of a resonant circuit (capacitance component of a LC resonant circuit) of a radio frequency device, or as a capacitance component for coupling the resonant circuits. Accordingly, by simultaneously forming an inductor utilizing the lower electrode layer, upper electrode layer or extraction electrode layer of the variable capacitance thin film capacitor device, or forming another resonant circuit in a margin area (where there is no variable capacitance thin film capacitor device formed) of the supporting substrate 1, the variable capacitance thin film capacitor can be used as a component of a voltage controlled radio frequency resonant circuit. In addition, it can be used for radio frequency devices, which are composite parts combining the resonant circuits, including voltage controlled radio frequency filters, voltage controlled matching circuit chips, voltage controlled antenna duplexers and the like.

EXAMPLE 5

A sapphire R substrate was used as the supporting substrate, on which a lower electrode layer 2 comprising Pt was formed by sputtering with a substrate temperature of 500° C. A thin film dielectric layer 3 was formed using $(Ba_{0.5}Sr_{0.5})TiO_3$ (BST) as the target, in which the deposition was performed in the same batch with a substrate temperature of 800° C. for 15 minutes. Meanwhile, annealing was performed prior to the start of the deposition at 800° C. for 15 minutes so as to flatten the Pt electrode.

On top of the layer, Pt and Au electrode layers were deposited in the same batch as the upper electrode layer 4. Then, after a resist was applied and formed into a predetermined pattern by photolithography, the upper electrode layer 4 was etched with an ECR device. Thereafter, the BST layer 3 and the lower electrode layer 2 were also etched with the ECR device. The geometry of the lower electrode layer 2 was designed to include the conductor lines 31–35.

Subsequently, tantalum nitride was deposited as the thin film resistors 61–66 by sputtering at 100° C. After the sputtering, a resist was applied and formed into a predetermined pattern by photolithography, and then etching with an RIE device was performed to remove the resist layer. All the thin film resistors were formed to have an aspect ratio of 20.

Subsequently, a $SiO_2$ film was deposited as the insulation layer 5 in a CVD device using a TEOS gas. Then after a resist was patterned, the film was etched into a predetermined pattern by RIE.

Thereafter, as the extraction electrode layer 7, Ni and Au were deposited by sputtering and formed into a predetermined pattern.

Lastly, the protective layer 8, solder diffusion barrier layer 11, solder terminals 111 and 112 were successively formed. A polyimide resin was used for the protective layer 8, and Ni was used for the solder diffusion barrier layer 11.

Additionally, the resistance of the thin film resistors was measured to be about 100 kΩ.

Figure 24:
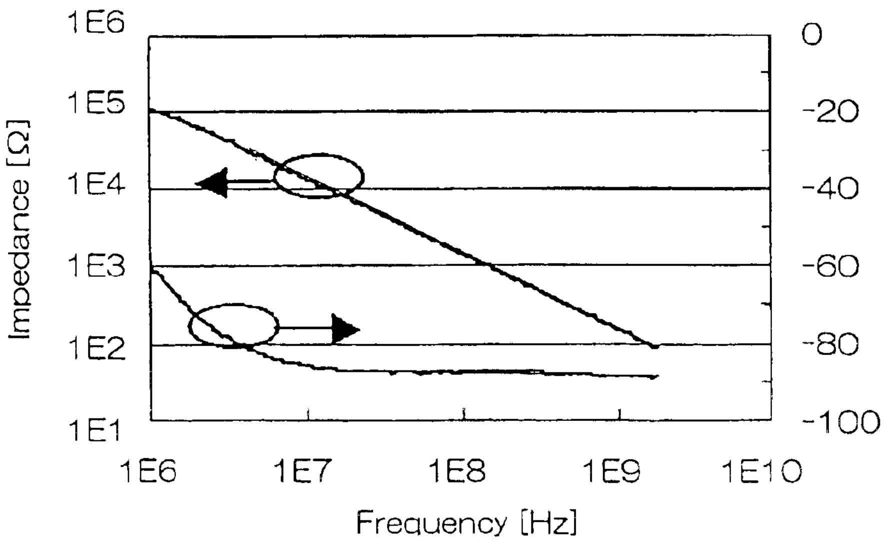
FIG. 24 is a graph showing impedance and phase characteristics of a variable capacitance thin film capacitor.

A measurement of the variable capacitance thin film capacitor device obtained in the foregoing way was performed with an impedance analyzer, the result of which is shown in FIG. 24. An influence of the bias lines is observed around 1.0 MHz, while no influence is observed in the radio frequency region.

Figure 25:
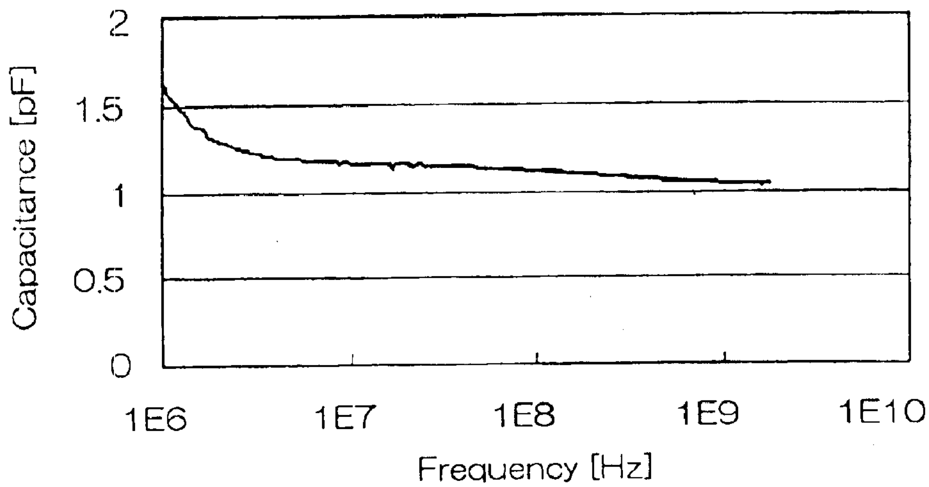
FIG. 25 is a graph showing a capacitance characteristic of the variable capacitance thin film capacitor.

FIG. 25 shows the dependence of the capacitance on the frequency. An increase of the capacitance due to the influence of the bias lines is observed around 1.0 MHz, while the capacitance is about 1 pF in the radio frequency region. The ratio of capacitance change is about 20% at DC 3V.

COMPARATIVE EXAMPLE 2

Figure 26:
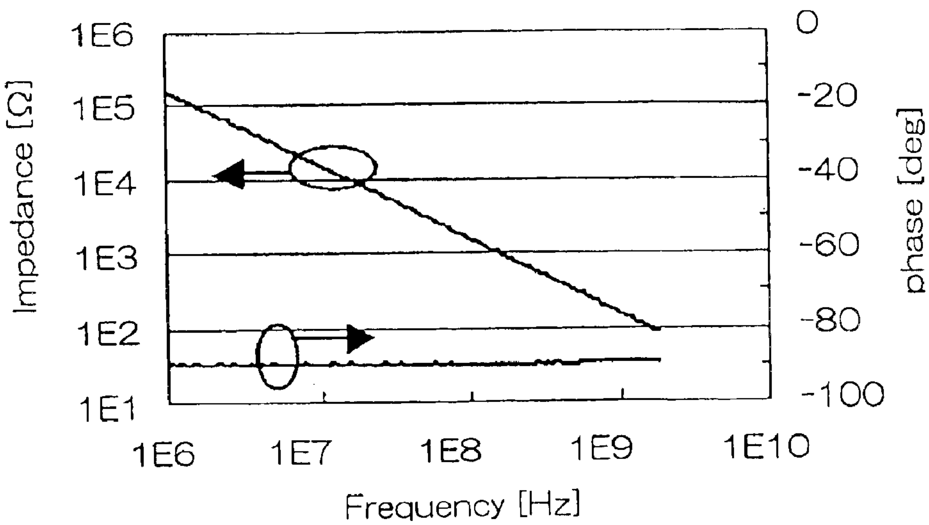
FIG. 26 is a graph showing impedance and phase characteristics of a comparative example.

As a comparative example, a variable capacitance thin film capacitor device was fabricated with essentially the same structure as the forgoing example, except that the bias lines were not provided. The result of a measurement of the variable capacitance thin film capacitor device with the impedance analyzer is shown in FIG. 26. Because of the absence of the bias lines, the phase is almost constant at −90 degrees.

Figure 27:
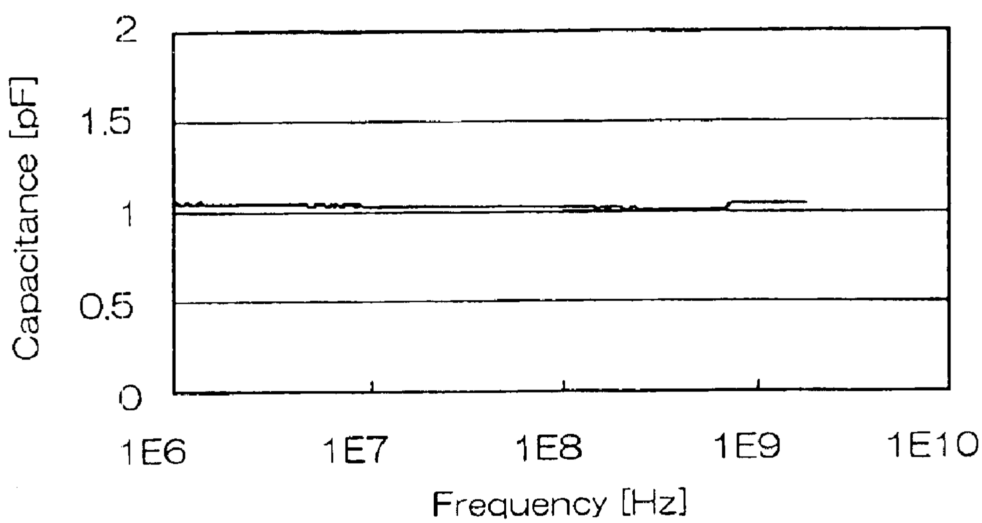
FIG. 27 is a graph showing a capacitance characteristic of the comparative example.

The dependence of the capacitance on the frequency is shown in FIG. 27. The capacitance is about 1.0 pF even around 1.0 MHz. The ratio of capacitance change at DC 3V is 2.9%. The DC bias voltage necessary for obtaining the same capacitance change ratio as in the example is 21 V.

The results obtained from the example and comparative example show that a variable capacitance thin film capacitor that allows the capacitance elements to be connected in parallel in a direct current region and in series in a radio frequency region can be provided by the present invention. By forming the bias lines directly on the supporting substrate and using high resistance thin film resistors, the number of layers can be reduced, and the characteristics and reliability are improved without increasing the device size.

Specific embodiments of the present invention have been heretofore described. However, it should be understood that implementation of the present invention is not limited to the specific embodiments described above, but various modifications may be made within the scope of the invention.

What is claimed is:

1. A variable capacitance circuit comprising:

first to Nth variable capacitance elements sequentially connected in series between an input terminal and an output terminal, whose capacitances change depending on voltage applied thereto;

an ith bias line on the input terminal side provided between an input terminal portion of the first variable capacitance element and a connection point between a 2ith variable capacitance element and a (2i+1)th variable capacitance element; and an ith bias line on the output terminal side provided between an output terminal portion of the Nth variable capacitance element and a connection point between a (2i−1)th variable capacitance element and the 2ith variable capacitance element, where N and i are integers satisfying $N=2n+1$, $n \geqq 1$, $1 \leqq i \leqq n$, wherein the input terminal comprises a single input terminal that serves both as a signal input terminal for receiving radio frequency signals and an input terminal for application of direct current bias.

2. The variable capacitance circuit according to claim 1, wherein the ith bias line on the input terminal side and the ith bias line on the output terminal side each include a resistance component and/or an inductance component.

3. The variable capacitance circuit according to claim 2, wherein the impedance of the ith bias line on the input terminal side or the ith bias line on the output terminal side is selected so that a divided voltage applied to one of the series connected first to Nth variable capacitance elements when all the bias lines are not present is smaller than a divided voltage applied to one of the series connected first to Nth variable capacitance elements through the bias lines when the bias lines are present.

4. The variable capacitance circuit according to claim 2, wherein the impedance of the ith bias line on the input terminal side or the ith bias line on the output terminal side is selected so as to be larger than a combined impedance of the variable capacitance elements connected in parallel to the bias lines at an operational radio frequency.

5. The variable capacitance circuit according to claim 1, wherein the output terminal serves both as a signal output terminal for radio frequency signals and an output terminal for direct current bias.

6. The variable capacitance circuit according to claim 1, wherein N=3 and n=1.

7. The variable capacitance circuit according to claim 1, wherein a plurality of groups of the first to Nth variable capacitance elements connected in series are provided between the input and output terminals, and the ith bias line on the input terminal side and the ith bias line on the output terminal side are each included in each of the groups.

8. A variable capacitance thin film capacitor device comprising:

first to Nth variable capacitance elements formed on a supporting substrate that are sequentially connected in series, whose capacitances change depending on voltage applied thereto;

an ith bias line on an input terminal side provided between an input terminal portion of the first variable capacitance element and a connection point between a 2ith variable capacitance element and a (2i+1)th variable capacitance element; and an ith bias line on an output terminal side provided between an output terminal portion of the Nth variable capacitance element and a connection point between a (2i−1)th variable capacitance element and the 2ith variable capacitance element, where N and i are integers satisfying $N=2n+1$, $n \geqq 1$, $1 \leqq i \leqq n$, wherein the input terminal portion comprises a single input terminal that serves both as a signal input terminal for receiving radio frequency signals and an input terminal for application of direct current bias.

9. The variable capacitance thin film capacitor device according to claim 8, which comprises a lower electrode layer, a thin film dielectric layer, and an upper electrode layer that are sequentially stacked on the supporting substrate.

10. The variable capacitance thin film capacitor device according to claim 9, wherein the thin film dielectric layer comprises $(Ba_xSr_{1-x})Ti_yO_{3-x}$.

11. The variable capacitance thin film capacitor device according to claim 8, wherein the supporting substrate comprises an input terminal for connection to the input terminal portion of the first variable capacitance element and an output terminal for connection to the output terminal portion of the Nth variable capacitance element formed thereon.

12. The variable capacitance thin film capacitor device according to claim 8, wherein the bias lines are formed over the variable capacitance elements connected in series with an insulation layer interposed therebetween.

13. The variable capacitance thin film capacitor device according to claim 8, wherein the bias lines are formed directly on the supporting substrate.

14. The variable capacitance thin film capacitor device according to claim 8, wherein the bias lines are in the form of a straight line, loop, meander or spiral.

15. The variable capacitance thin film capacitor device according to claim 8, wherein the bias lines comprise a high resistance alloy thin film including a Ni—Cr alloy or a Fe—Cr—Al alloy.

16. The variable capacitance thin film capacitor device according to claim 8, wherein the bias lines comprise a thin film of a precious metal including Au or Pt.

17. The variable capacitance thin film capacitor device according to claim 8, wherein the bias lines comprise a ferromagnetic thin film including Ni or Fe.

18. The variable capacitance thin film capacitor device according to claim 8, wherein the bias lines comprise an oxide conductor, nitride conductor or semiconductor.

19. The variable capacitance thin film capacitor device according to claim 8, wherein the bias lines comprise at least in part a thin film resistor.

20. The variable capacitance thin film capacitor device according to claim 19, wherein the bias lines comprise a conductor line and the thin film resistor.

21. The variable capacitance thin film capacitor device according to claim 19, wherein the thin film resistor comprises tantalum and has a specific resistance of 1 mΩcm or more.

22. The variable capacitance thin film capacitor device according to claim 19, wherein the thin film resistor has a thickness of 40 nm or more.

23. The variable capacitance thin film capacitor device according to claim 19, wherein the thin film resistor comprises tantalum nitride.

24. The variable capacitance thin film capacitor device according to claim 19, wherein the thin film resistor comprises a high resistance alloy thin film including a Ni—Cr alloy or Fe—Cr—Al alloy.

25. The variable capacitance thin film capacitor device according to claim 19, wherein the thin film resistor comprises a thin film of a precious metal including Au or Pt.

26. The variable capacitance thin film capacitor device according to claim 19, wherein the thin film resistor comprises a ferromagnetic thin film including Ni or Fe.

27. The variable capacitance thin film capacitor device according to claim 19, wherein the thin film resistor comprises an oxide conductor, nitride conductor or semiconductor.

28. The variable capacitance thin film capacitor device according to claim 8, wherein the bias lines are coated with a protective film comprising at least one kind selected between silicon nitride and silicon oxide.

29. The variable capacitance thin film capacitor device according to claim 8, wherein N=3 and n=1.

30. A radio frequency device comprising a resonant circuit which includes in part a variable capacitance thin film capacitor device comprising first to Nth variable capacitance elements formed on a supporting substrate that are sequentially connected in series, whose capacitances change depending on voltage applied thereto, the radio frequency device comprising:

an ith bias line on an input terminal side provided between an input terminal portion of the first variable capacitance element and a connection point between a 2ith variable capacitance element and a (2i+1)th variable capacitance element; and an ith bias line on an output terminal side provided between an output terminal portion of the Nth variable capacitance element and a connection point between a (2i−1)th variable capacitance element and the 2ith variable capacitance element, where N and i are integers satisfying $N=2n+1$, $n \geqq 1$, $1 \leqq i \leqq n$, wherein the input terminal portion comprises a single input terminal that serves both as a signal input terminal for receiving radio frequency signals and an input terminal for application of direct current bias.

31. A radio frequency device comprising a variable capacitance thin film capacitor device for use as a capacitance element for coupling a plurality of resonant circuits, the variable capacitance thin film capacitor device comprising first to Nth variable capacitance elements formed on a supporting substrate that are sequentially connected in series, whose capacitances change depending on voltage applied thereto, the radio frequency device comprising:

an ith bias line on an input terminal side provided between an input terminal portion of the first variable capacitance element and a connection point between a 2ith variable capacitance element and a (2i+1)th variable capacitance element; and an ith bias line on an output terminal side provided between an output terminal portion of the Nth variable capacitance element and a connection point between a (2i−1)th variable capacitance element and the 2ith variable capacitance element, where N and i are integers satisfying $N=2n+1$, $n \geqq 1$, $1 \leqq i \leqq n$, wherein the input terminal portion comprises a single input terminal that serves both as a signal input terminal for receiving radio frequency signals and an input terminal for application of direct current bias.

* * * * *